United States Patent
Takahashi et al.

(10) Patent No.: US 9,673,080 B2
(45) Date of Patent: Jun. 6, 2017

(54) SEMICONDUCTOR PIECE MANUFACTURING METHOD

(71) Applicant: FUJI XEROX CO., LTD., Minato-ku, Tokyo (JP)

(72) Inventors: Mutsuya Takahashi, Ebina (JP); Shuichi Yamada, Ebina (JP); Michiaki Murata, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/085,286

(22) Filed: Mar. 30, 2016

(65) Prior Publication Data

US 2016/0211180 A1    Jul. 21, 2016

Related U.S. Application Data

(63) Continuation of application No. 14/885,447, filed on Oct. 16, 2015, now Pat. No. 9,455,173, which is a
(Continued)

(30) Foreign Application Priority Data

Jul. 1, 2013   (JP) ................................ 2013-137829
May 27, 2014   (JP) ................................ 2014-108981
(Continued)

(51) Int. Cl.
*H01L 21/304*    (2006.01)
*H01L 21/683*    (2006.01)
(Continued)

(52) U.S. Cl.
CPC ........ *H01L 21/6836* (2013.01); *H01L 21/308* (2013.01); *H01L 21/3043* (2013.01);
(Continued)

(58) Field of Classification Search
CPC ... H01L 21/78; H01L 21/304; H01L 21/3065; H01L 21/308; H01L 21/6836; H01L 21/3043; H01L 21/6835
See application file for complete search history.

(56) References Cited

U.S. PATENT DOCUMENTS 5,273,615 A * 12/1993 Asetta ................... B23B 31/307
                                                                              156/152
5,882,986 A      3/1999   Eng et al.
(Continued)

FOREIGN PATENT DOCUMENTS

JP      61-267343 A    11/1986
JP      04-010554 A    1/1992
(Continued)

OTHER PUBLICATIONS

Office Action dated Jul. 29, 2014, issued by the Japanese Patent Office in counterpart Japanese Application No. 2014-108983.
(Continued)

*Primary Examiner* — Christine Enad
(74) *Attorney, Agent, or Firm* — Sughrue Mion, PLLC

(57) ABSTRACT

A semiconductor piece manufacturing method includes: a process of forming a fine groove on a front surface side including a first groove portion having a width that is gradually narrowed from a front surface of a semiconductor substrate W toward a rear surface thereof; a process of attaching a dicing tape having an adhesive layer on the front surface after the fine groove on the front surface side is formed; a process of forming a groove on a rear surface side having a width greater than the width of the fine groove on the front surface side along the fine groove on the front surface side from a rear surface side of the substrate by a
(Continued)

FORWARD TAPERED SHAPE AND VERTICAL SHAPE

ENTRANCE OF ADHESIVE LAYER rotating dicing blade; and a process of separating the dicing tape from the front surface after the groove on the rear surface side is formed.

13 Claims, 15 Drawing Sheets

Related U.S. Application Data continuation of application No. PCT/JP2014/067015, filed on Jun. 26, 2014.

(30) Foreign Application Priority Data

May 27, 2014 (JP) ................................ 2014-108982
May 27, 2014 (JP) ................................ 2014-108983

(51) Int. Cl.
   *H01L 33/00*      (2010.01)
   *H01L 21/3065*   (2006.01)
   *H01L 21/308*    (2006.01)
   *H01L 21/78*     (2006.01)

(52) U.S. Cl.
   CPC ...... *H01L 21/3065* (2013.01); *H01L 21/6835* (2013.01); *H01L 21/78* (2013.01); *H01L 33/0095* (2013.01); *H01L 2221/6834* (2013.01); *H01L 2221/68327* (2013.01); *H01L 2221/68381* (2013.01)

(56) References Cited

U.S. PATENT DOCUMENTS

| | | | |
|---|---|---|---|
| 5,998,234 A | 12/1999 | Murata et al. | |
| 6,245,596 B1 | 6/2001 | Kosaki | |
| 6,515,309 B1 | 2/2003 | Tohyama et al. | |
| 7,897,485 B2 | 3/2011 | Parekh | |
| 2004/0043614 A1 | 3/2004 | Koizumi | |
| 2010/0248451 A1 | 9/2010 | Pirogovsky | |
| 2011/0008949 A1 | 1/2011 | Sugimura et al. | |
| 2011/0062479 A1 | 3/2011 | Sugano | |
| 2012/0322240 A1 | 12/2012 | Holden et al. | |

FOREIGN PATENT DOCUMENTS

| | | |
|---|---|---|
| JP | 09-320996 A | 12/1997 |
| JP | 2000-195827 A | 7/2000 |
| JP | 2003-124151 A | 4/2003 |
| JP | 2003-158097 A | 5/2003 |
| JP | 2005-277297 A | 10/2005 |
| JP | 2009-088109 A | 4/2009 |
| JP | 2011-018669 A | 1/2011 |
| JP | 2011-077418 A | 4/2011 |
| JP | 2011-210944 A | 10/2011 |
| JP | 2012-235168 A | 11/2012 |

OTHER PUBLICATIONS

Office Action dated Jul. 29, 2014, issued by the Japanese Patent Office in counterpart Japanese Application No. 2014-108981.
Search Report dated Aug. 5, 2014, issued by the International Searching Authority in counterpart International Application No. PCT/JP2014/067015 (PCT/ISA/210).
Written Opinion dated Aug. 5, 2014, issued by the International Searching Authority in counterpart International Application No. PCT/JP2014/067015 (PCT/ISA/237).
Office Action dated Jul. 29, 2014, issued by the Japanese Patent Office in counterpart Japanese Application No. 2014-108982.
Communication dated Mar. 3, 2017 issued by the State Intellectual Property Office of P.R.C. in counterpart Chinese Patent Application No. 201480034349.5.

* cited by examiner

FORWARD TAPERED SHAPE

ENTRANCE OF ADHESIVE LAYER

FORWARD TAPERED SHAPE
AND VERTICAL SHAPE

ENTRANCE OF ADHESIVE LAYER

FORWARD TAPERED SHAPE AND
REVERSE TAPERED SHAPE

ENTRANCE OF ADHESIVE LAYER

REVERSE TAPERED SHAPE

ENTRANCE OF ADHESIVE LAYER

VERTICAL SHAPE

ENTRANCE OF ADHESIVE LAYER

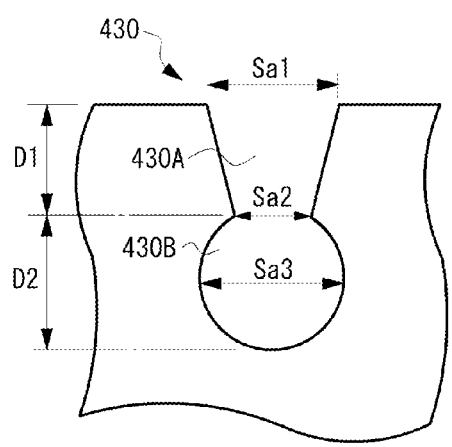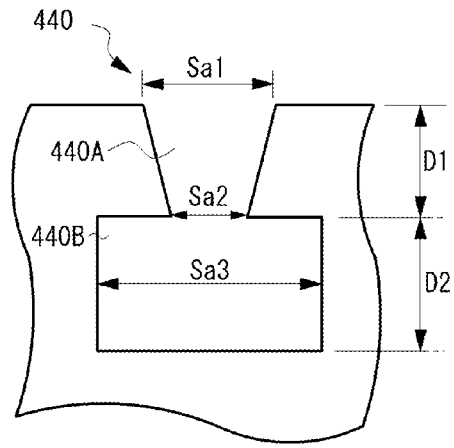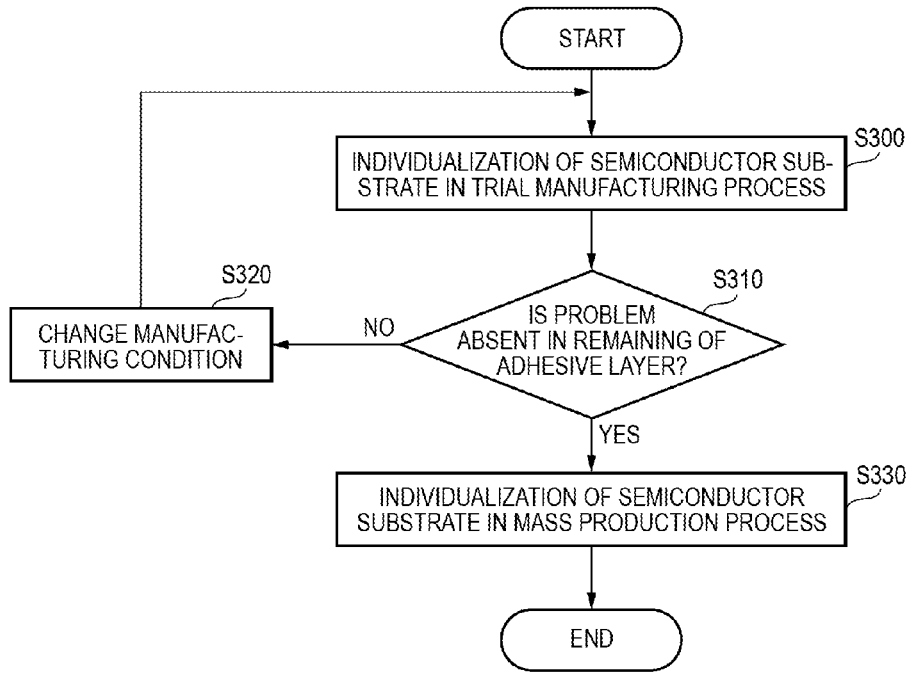

SEMICONDUCTOR PIECE MANUFACTURING METHOD

CROSS REFERENCE TO RELATED APPLICATION

This is a continuation of U.S. application Ser. No. 14/885,447 filed Oct. 16, 2015, which is a continuation of International Application No. PCT/JP2014/067015 filed on Jun. 26, 2014, and claims priority from Japanese Patent Application No. 2013-137829, filed on Jul. 1, 2013, Japanese Patent Application No. 2014-108981, filed on May 27, 2014, Japanese Patent Application No. 2014-108982, filed on May 27, 2014 and Japanese Patent Application No. 2014-108983, filed on May 27, 2014, the disclosures of which are incorporated herein in their entirety.

BACKGROUND

Technical Field

The present invention relates to a semiconductor piece manufacturing method.

SUMMARY

An aspect of the present invention provides a semiconductor piece manufacturing method includes: a process of forming a groove on a front surface side including a first groove portion having a width that is gradually narrowed from a front surface of a substrate toward a rear surface thereof; a process of attaching a holding member having an adhesive layer on the front surface after the groove on the front surface side is formed; a process of forming a groove on a rear surface side having a width greater than the width of the groove on the front surface along the groove on the front surface side from a rear surface side of the substrate by a rotating cutting member; and a process of separating the holding member from the front surface after the groove on the rear surface side is formed.

BRIEF DESCRIPTION OF THE DRAWINGS

Exemplary embodiment(s) of the present invention will be described in detail based on the following figures, wherein:

FIGS. 7A to 7D illustrate fine grooves according to an embodiment of the invention, in which FIGS. 7A and 7B are cross-sectional views illustrating a first preferred shape of a fine groove, and FIGS. 7C and 7D are cross-sectional views illustrating a second preferred shape of a fine groove;

FIGS. 8A and 8B illustrate fine grooves according to an embodiment of the invention, in which FIGS. 8A and 8B are cross-sectional views illustrating a third preferred shape of a fine groove;

FIGS. 9A to 9D illustrate fine grooves according to a comparative example, in which FIGS. 9A and 9B are cross-sectional views illustrating a fine groove of a reverse tapered shape, and FIGS. 9C and 9D are cross-sectional views illustrating a fine groove of a vertical shape;

FIG. 13B is a diagram illustrating a load applied to the step portion during cutting performed by a dicing blade, and FIG. 13C is a diagram illustrating breakage of the step portion;

FIGS. 15A and 15B are cross-sectional views illustrating another configuration example of a fine groove according to an embodiment of the invention; and FIG. 16 is a flowchart illustrating another example of a semiconductor piece manufacturing process according to an embodiment of the invention.

DETAILED DESCRIPTION

Figure 1:
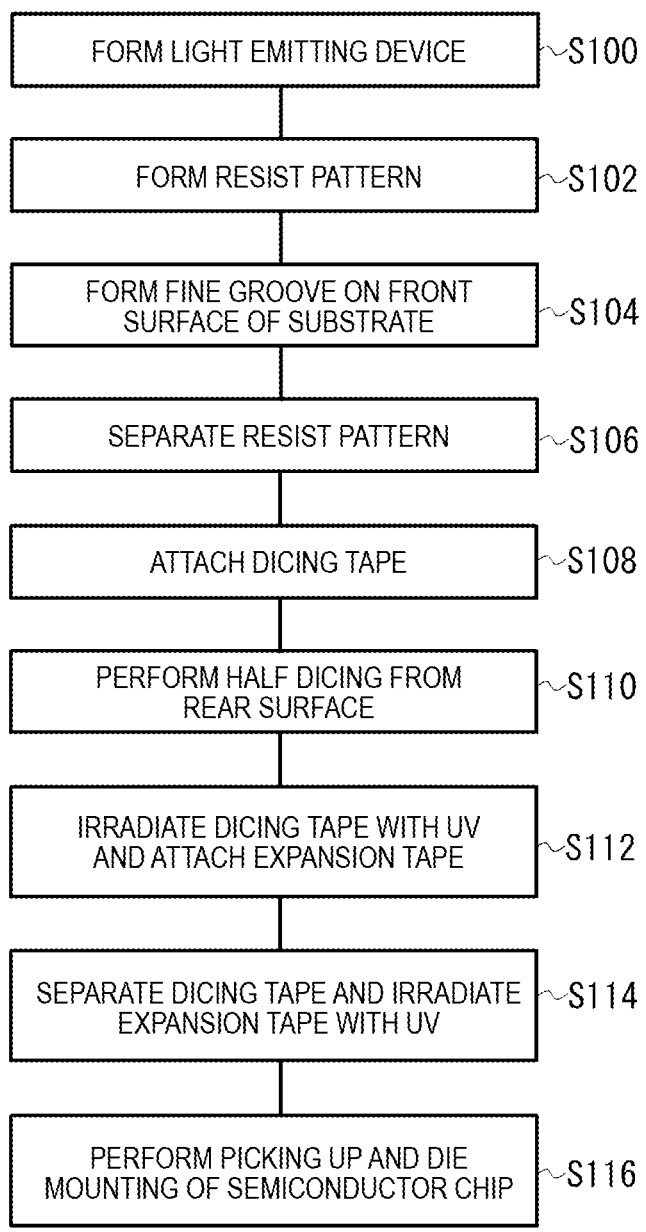
FIG. 1 is a flowchart illustrating an example of a semiconductor piece manufacturing process according to an embodiment of the invention.

A semiconductor piece manufacturing method of the invention is applied to a method for dividing (individualizing) a substrate-like member such as a semiconductor wafer on which plural semiconductor devices are formed to manufacture individual semiconductor pieces (semiconductor chips), for example. The semiconductor device formed on the substrate is not particularly limited, and may include a light emitting device, an active device, a passive device, or the like. In a preferred embodiment, the manufacturing method of the invention is applied to a method of extracting a semiconductor piece that includes a light emitting device from a substrate, in which the light emitting device may be a surface emitting semiconductor laser, a light emitting diode or a light emitting thyristor, for example. A single semiconductor piece may include a single light emitting device, or may include plural light emitting devices that are arranged in an array form. Further, the single semiconductor piece may include a drive circuit that drives the single or plural light emitting devices. Further, the substrate may be a substrate formed of silicon, SiC, compound semiconductor, sapphire, or the like, but are not limited thereto, and may be a substrate formed of other materials as long as the substrate is a substrate including at least the semiconductor (hereinafter, collectively referred to as a semiconductor substrate). In a preferred embodiment, the substrate is a III-V compound semiconductor substrate made of GaAs or the like on which a light emitting device such as a surface light emitting semiconductor laser or a light emitting diode is formed.

In the following description, a method for extracting individual semiconductor pieces (semiconductor chips) from a semiconductor substrate on which plural light emitting devices are formed will be described with reference to the accompanying drawings. It should be noted that the scale or shape in the drawings is emphasized for ease of understanding of features of the invention and is not necessarily the same as the scale or shape of an actual apparatus.

Embodiment

FIG. 1 is a flowchart illustrating an example of a semiconductor piece manufacturing process according to an embodiment of the invention. As shown in FIG. 1, a semiconductor piece manufacturing method of the present embodiment includes a process of forming a light emitting device (S100), a process of forming a resist pattern (S102), a process of forming a fine groove on a front surface of a semiconductor substrate (S104), a process of separating the resist pattern (S106), a process of attaching a dicing tape to the front surface of the semiconductor substrate (S108), a process of performing half dicing from a rear surface of the semiconductor substrate (S110), a process of irradiating the dicing tape with ultraviolet rays (UV) and attaching an expansion tape to the rear surface of the semiconductor substrate (S112), a process of separating the dicing tape and irradiating the expansion tape with ultraviolet rays (S114), and a process of picking up a semiconductor piece (semiconductor chip) to perform die mounting on a circuit board or the like (S116). Cross-sectional views of a semiconductor substrate shown in FIGS. 2A to 2D and FIGS. 3A to 3E correspond to the respective processes of steps S100 to S116, respectively.

Figure 2A:
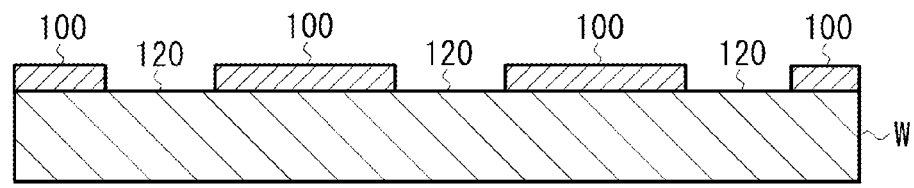
FIGS. 2A to 2D are cross-sectional views schematically illustrating a semiconductor substrate in a semiconductor piece manufacturing process according to an embodiment of the invention.

In the process of forming the light emitting device (S100), as shown in FIG. 2A, plural light emitting devices 100 are formed on a front surface of a semiconductor substrate W made of GaAs or the like. The light emitting device 100 is a surface light emitting semiconductor laser, a light emitting diode, a light emitting thyristor, or the like. In the figure, it is shown that one region corresponds to the light emitting device 100, but one light emitting device 100 is only an example of a device included in one individualized semiconductor piece. Thus, it should be noted that plural light emitting devices or another circuit element as well as one light emitting device may be included in the region of one light emitting device 100.

Figure 4:
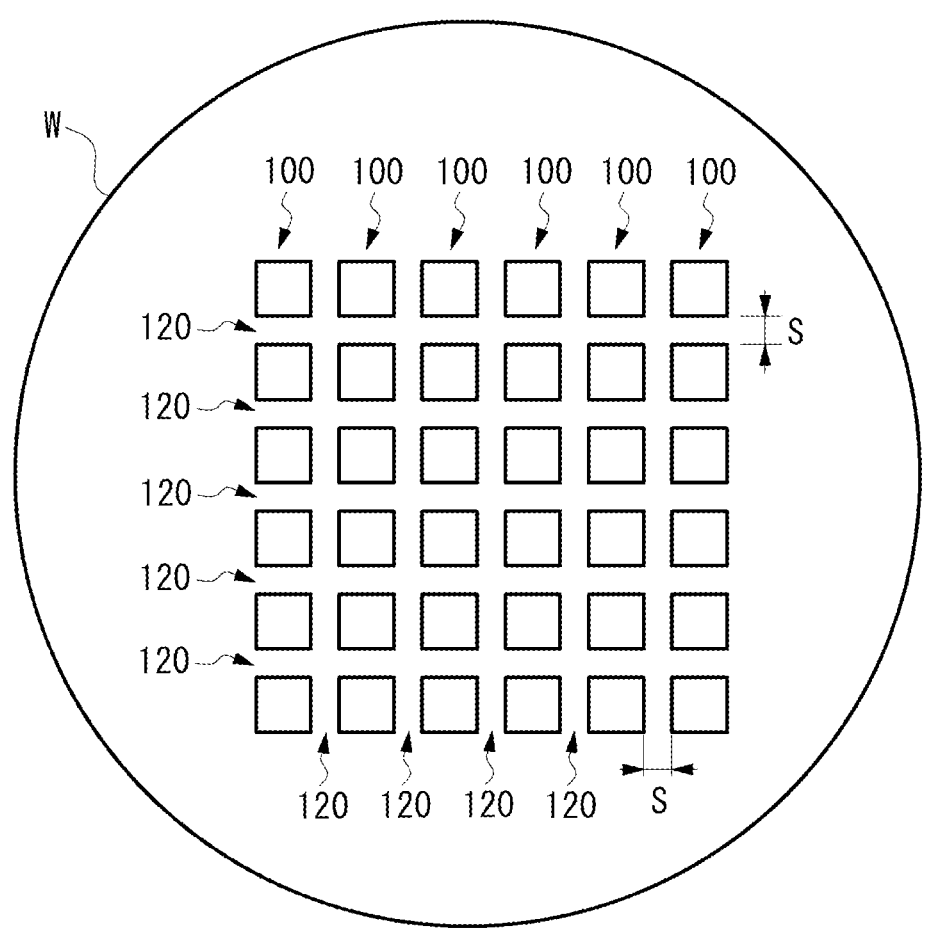
FIG. 4 is a plan view schematically illustrating a semiconductor substrate (wafer) when circuit formation is completed.

FIG. 4 is a plan view illustrating an example of the semiconductor substrate W when the light emitting device forming process is completed. In the figure, for ease of description, only the light emitting devices 100 in a central portion thereof are shown. On the front surface of the semiconductor substrate W, the plural light emitting devices 100 are arranged in an array form in row and column directions. A planar region of one light emitting device 100 generally has a rectangular shape, and the respective light emitting devices 100 are spaced from each other in a grid shape by cutting regions 120 defined by scribe lines or the like with a predetermined space S.

Figure 2B:
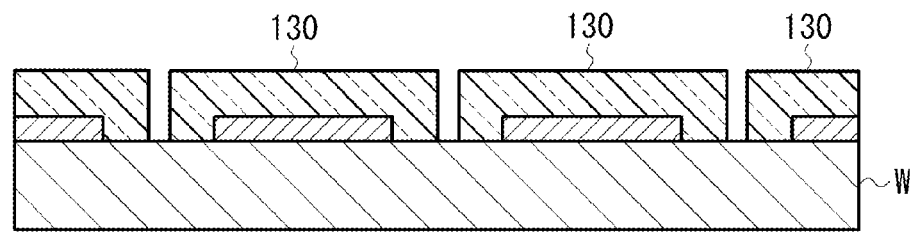

If the formation of the light emitting device is completed, a resist pattern is formed on the front surface of the semiconductor substrate W (S102). As shown in FIG. 2B, a resist pattern 130 is processed so that the cutting region 120 defined by the scribe line or the like on the front surface of the semiconductor substrate W is exposed. The processing of the resist pattern 130 is performed by a photolithography process.

Figure 2C:
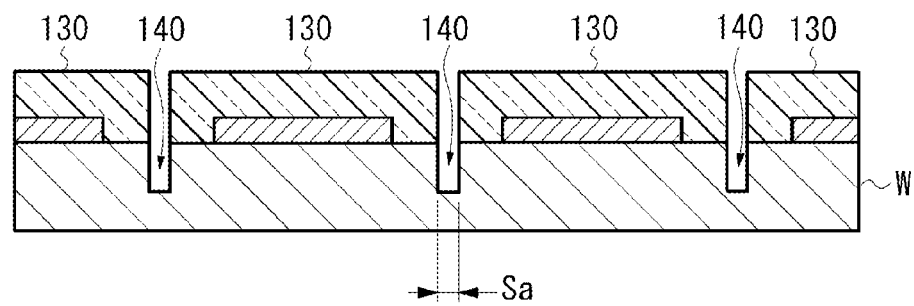

Then, a fine groove is formed on the front surface of the semiconductor substrate W (S104). As shown in FIG. 2C, a fine groove (hereinafter, for ease of description, referred to as a fine groove or a front surface side groove) 140 having a predetermined depth is formed on the front surface of the semiconductor substrate W using the resist pattern 130 as a mask. Such a groove may be formed by anisotropic etching, and preferably, is formed by anisotropic plasma etching which is anisotropic dry etching (reactive ion etching). The groove may be formed by a thin dicing blade, isotropic etching, or the like, but it is preferable that the anisotropic dry etching is used since a narrow deep groove can be formed compared with a case where the front surface side groove is formed by isotropic etching, and since the influence of vibration, stress or the like on the light emitting device 100 in the vicinity of the fine groove can be suppressed compared with a case where the dicing blade is used. A width Sa of the fine groove 140 is approximately the same as the width of an opening formed in the resist pattern 130. The width Sa of the fine groove 140 is several micrometers to ten and several micrometers, for example. Preferably, the width Sa is approximately 3 μm to approximately 15 μm. Further, the depth is about 10 μm to about 100 μm, for example, which is formed as a depth at least greater than a depth at which a functional element such as a light emitting device is formed. Preferably, the depth of the microgroove 140 is approximately 30 μm to approximately 80 μm. When the fine groove 140 is formed by a general dicing blade, a space S of the cutting region 120 increases up to 40 μm to 80 μm as a total value of a groove width of the dicing blade and a margin width that reflects a pitching amount. On the other hand, when the fine groove 140 is formed by the semiconductor process, the groove width becomes narrow, and the margin width for cutting can also become narrower than the margin width when the dicing blade is used. In other words, the space S of the cutting region 120 can decrease, and thus, the light emitting devices can be disposed on the wafer with high density to increase the number of acquired semiconductor pieces. The "front surface side" in the embodiment refers to a surface side on which the functional element such as a light emitting device is formed, and a "rear surface side" refers to a surface side opposite to the "front surface side".

Figure 2D:
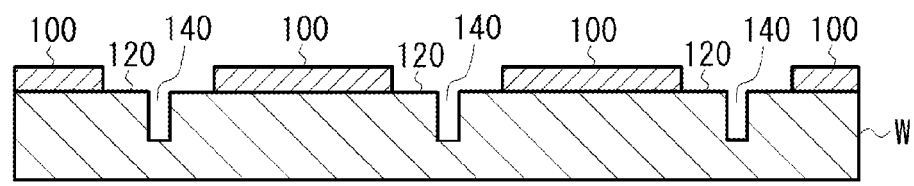

Then, the resist pattern is separated (S106). As shown in FIG. 2D, if the resist pattern 130 is separated from the front surface of the semiconductor substrate, the fine groove 140 formed along the cutting region 120 is exposed on the front surface. Details about the shape of the fine groove 140 will be described later.

Figure 3A:
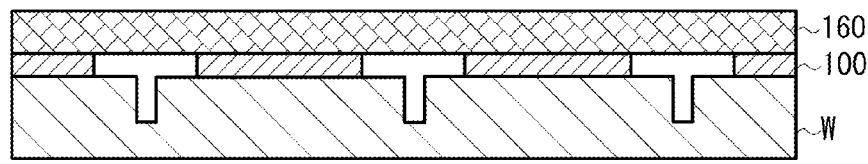
FIGS. 3A to 3E are cross-sectional views schematically illustrating a semiconductor substrate in a semiconductor piece manufacturing process according to an embodiment of the invention.
Figure 3B:
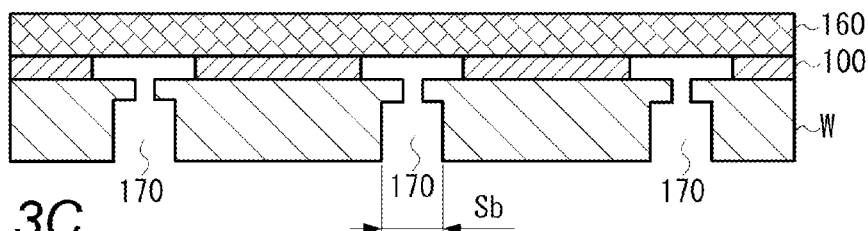
Figure 3C:
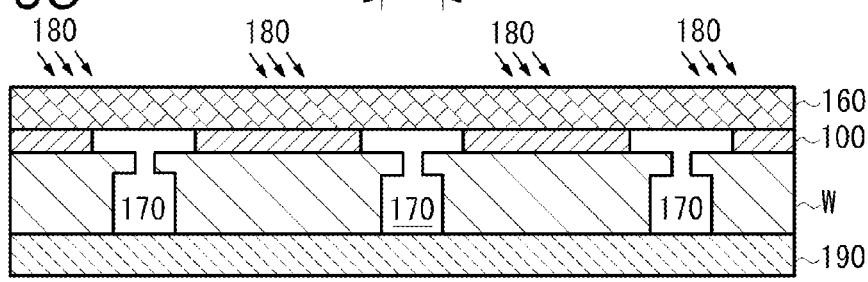
Figure 3D:
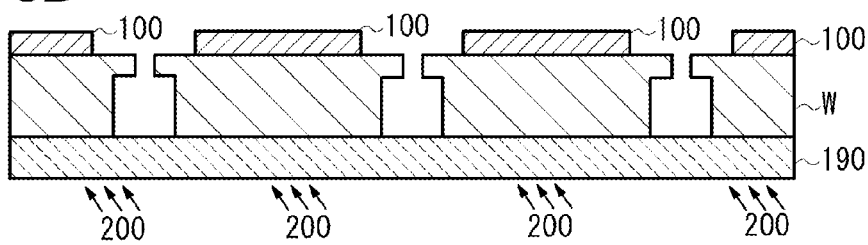
Figure 3E:
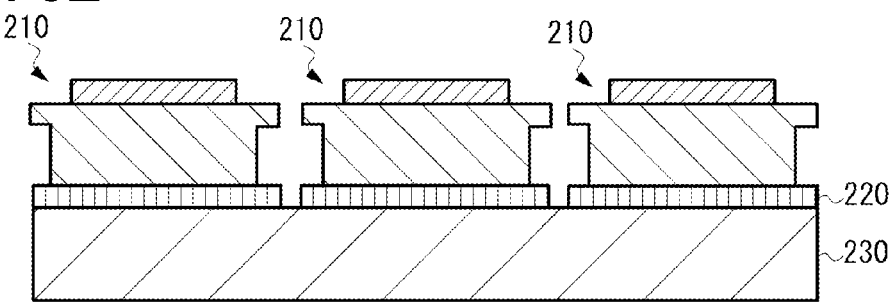

Then, an ultraviolet curing dicing tape is attached (S108). As shown in FIG. 3E, a dicing tape 160 having an adhesive layer is attached on the side of the light emitting device. Then, half dicing is performed along the fine groove 140 by a dicing blade from the rear surface side of the substrate (S110). Positioning of the dicing blade may use a method for disposing an infrared camera above the rear surface side of the substrate and allowing the substrate to transmit an infrared ray to indirectly detect the fine groove 140, a method for disposing a camera above the front surface side of the substrate and directly detecting the position of the fine groove 140, or other known methods. With such positioning, as shown in FIG. 3B, the half dicing is performed by the dicing blade, so that a groove 170 is formed on the rear surface side of the semiconductor substrate. The groove 170 has a depth that reaches the fine groove 140 formed on the front surface of the semiconductor substrate. Here, the fine groove 140 is formed with a width narrower than that of the groove 170 on the rear surface side formed by the dicing blade. This is because when the fine groove 140 is formed with the width narrower than that of the groove 170 on the rear surface side, the number of semiconductor pieces capable of being acquired from a single wafer can be increased compared with a case where the semiconductor substrate is cut only using the dicing blade. If the fine groove of several micrometers to ten and several micrometers shown in FIG. 2C can be formed in a range from the front surface of the semiconductor substrate to the rear surface thereof, it is not necessary to form the groove on the rear surface side using the dicing blade, but it is not easy to form the fine groove with such a depth. Accordingly, as shown in FIG. 3B, the half dicing from the rear surface using the dicing blade is combined.

Then, the dicing tape is irradiated with ultraviolet rays (UV), and the expansion tape is attached (S112). As shown in FIG. 3C, the dicing tape 160 is irradiated with ultraviolet rays 180, so that the adhesive layer is cured. Then, an expansion tape 190 is attached to the rear surface of the semiconductor substrate.

Then, the dicing tape is separated, and the expansion tape is irradiated with ultraviolet rays (S114). As shown in FIG. 3D, the dicing tape 160 is separated from the front surface of the semiconductor substrate. Further, the expansion tape 190 on the rear surface of the substrate is irradiated with ultraviolet rays 200, so that the adhesive layer is cured. The expansion tape 190 has elasticity in a base material thereof. The tape is expanded to increase the interval between the light emitting devices so as to easily pick up the individualized semiconductor pieces after dicing.

Then, pickup and die mounting of the individualized semiconductor pieces are performed (S116). As shown in FIG. 3E, a semiconductor piece (semiconductor chip) 210 picked up from the expansion tape 190 is mounted on a circuit board 230 through a fixing member 220 such as a conductive paste such as an adhesive or solder.

Figure 5:
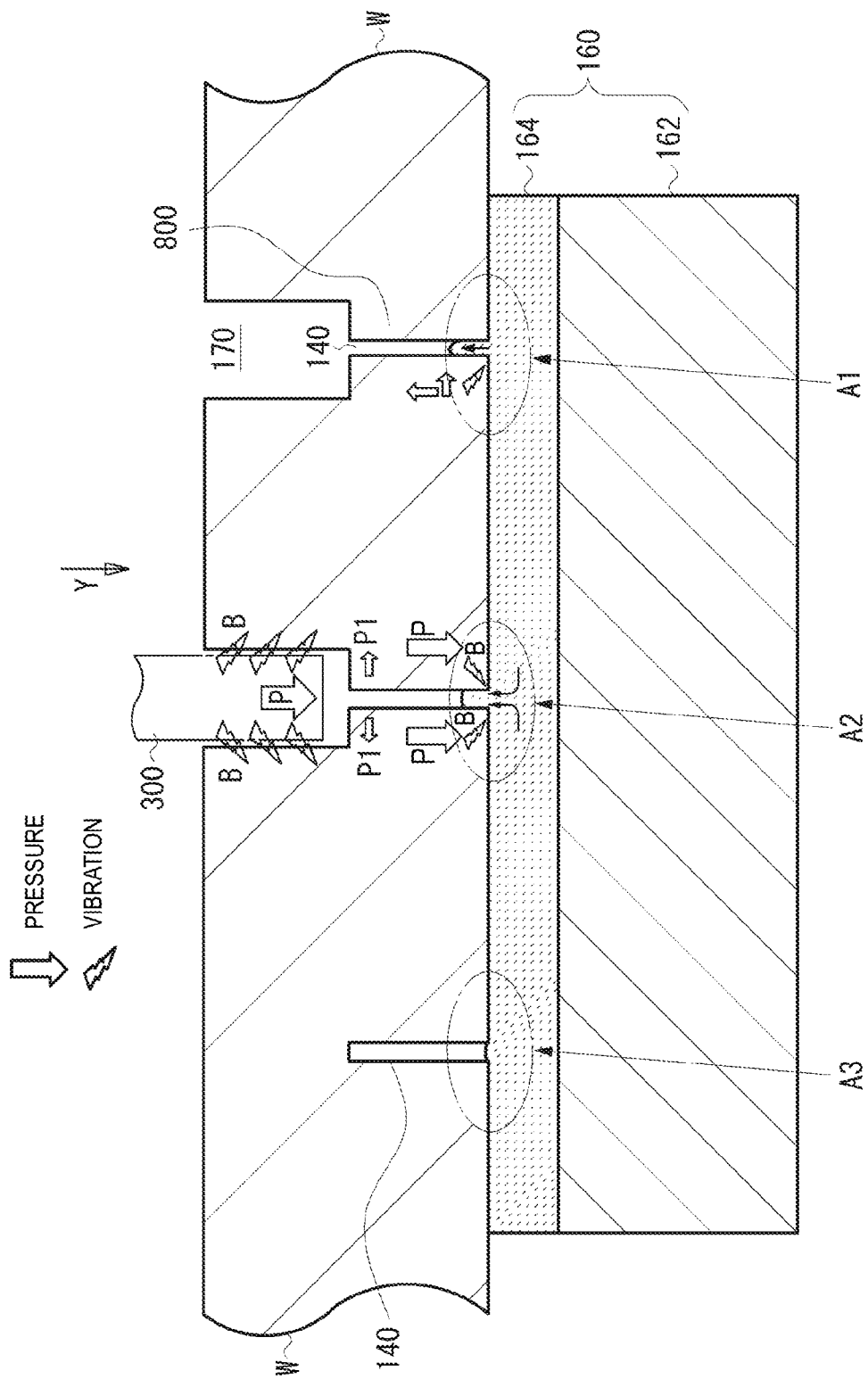
FIG. 5 is a cross-sectional view illustrating details of half dicing using a dicing blade.

Next, details about the half dicing using the dicing blade will be described. FIG. 5 shows an inverted state of an enlarged cross-sectional view when the half dicing is performed by the dicing blade shown in FIG. 3B. In FIGS. 3A to 3E, the light emitting device 100 formed on the front surface of the substrate is emphasized, whereas in FIG. 5, the light emitting device on the front surface of the substrate is not shown, but it is assumed that the light emitting device is formed on the front surface of the substrate as in FIGS. 3A to 3E.

As shown in FIG. 5, a dicing blade 300 cuts the semiconductor substrate W from the rear surface thereof along the fine groove 140 while rotating to form the groove 170 in the semiconductor substrate W. For example, the dicing blade 300 is a cutting member of a disk shape. Here, an example in which the tip portion has a constant thickness is shown, but a dicing blade in which the tip portion is tapered may be used. The groove 170 (kerf width) formed by the dicing blade 300 has approximately the same width as the width of the dicing blade 300. The groove 170 is processed to have a depth such that the groove 170 communicates with the fine groove 140. The dicing blade 300 is positioned outside the semiconductor substrate W in a direction parallel to the rear surface of the semiconductor substrate W. Further, by moving the dicing blade 300 in a direction Y perpendicular to the rear surface of the semiconductor substrate W by a predetermined distance, the positioning in the thickness direction of the semiconductor substrate W is performed so that a step portion 800 formed by a step difference formed in a connecting portion of the groove 170 and the fine groove 140 has a desired thickness T in the Y direction. Further, in a state where the dicing blade 300 is rotated after the positioning outside the semiconductor substrate W, at least one of the dicing blade 300 and the semiconductor substrate W is moved in the direction parallel to the rear surface of the semiconductor substrate W, to thereby form the groove 170 in the semiconductor substrate W. The step portion 800 is a portion between the step difference formed in the connecting portion of the groove 170 and the fine groove 140 and the semiconductor substrate W, that is, a beam shaped portion formed by a difference between the width of the groove 170 and the width the fine groove 140.

When the half dicing is performed by the dicing blade 300, the dicing tape 160 is attached onto the front surface of the substrate. The dicing tape 160 includes a tape base material 162, and an adhesive layer 164 that is stacked thereon. The adhesive layer 164 is made of an infrared ray curing resin, and has a characteristic that a specific viscosity or viscous property is maintained before irradiation of infrared rays and the adhesive property is lost by being cured with the irradiation of the infrared rays. Thus, when the dicing tape 160 is attached, the adhesive layer 164 is attached onto the front surface of the substrate including the fine grooves 140 to hold the semiconductor pieces so that the semiconductor pieces are not detached after dicing.

In a cutting line A2 shown in FIG. 5, vibration B and cutting pressure P are applied to the semiconductor substrate W through inner walls of the groove 170 by rotation of the dicing blade 300, relative movement of the dicing blade 300 and the semiconductor substrate W, or the like while the semiconductor substrate W is being cut. If the semiconductor substrate W is pressed in the Y direction by the cutting pressure P, the viscous adhesive layer 164 enters the fine groove 140. Further, as the vibration B is transferred to the vicinity of the fine groove 140, the flow of the adhesive layer 164 is promoted. Further, in the cutting using the dicing blade 300, a cutting water stream (jet water stream) mixed with chips is supplied to the groove 170, and pressure P1 is applied in a direction where the fine groove 140 is expanded by the cutting water stream. Thus, the entrance of the adhesive layer 164 is further promoted. As a result, in the case of a fine groove that does not have a forward tapered shape of the present embodiment which is to be described later, for example, the adhesive layer 164 may enter the fine groove 140 having a width of about 5 μm at an entrance depth of about 10 μm. Thus, in the present embodiment, even in the semiconductor piece manufacturing method in which the groove width on the front surface side is narrower than the groove width on the rear surface side, for example, in order to enhance the number of acquired semiconductor pieces, when the groove on the rear surface side is formed by a rotating cutting member, the fine groove having the forward tapered shape which is to be described later is formed although the number of acquired semiconductor pieces is slightly sacrificed.

In a cutting line A1 where the dicing is finished, since pressure is applied during cutting of the adjacent cutting line A2 so that the fine groove 140 is narrowed in the width direction, it is considered that the adhesive layer 164 that enters the fine groove 140 easily enters further inside. In a cutting line A3 on an opposite side before cutting, since the adhesive layer 164 is merely attached, it is considered that the amount of the adhesive layer 164 entering into the fine groove 140 is relatively small.

Figure 6:
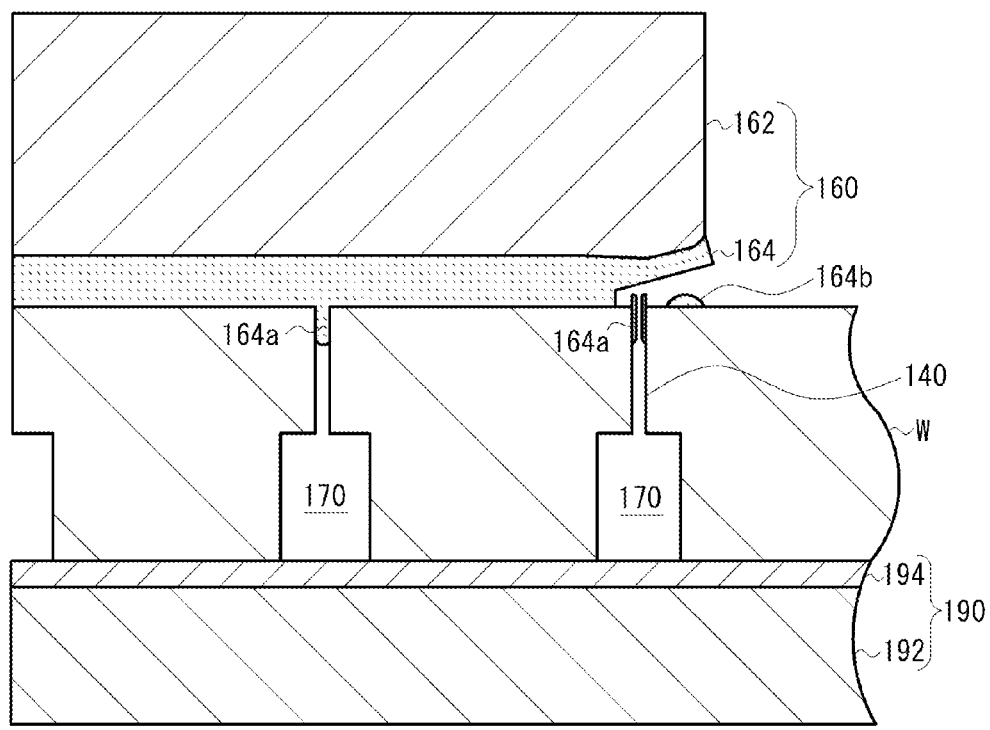
FIG. 6 is a cross-sectional view illustrating remaining of an adhesive layer when a dicing tape is separated from a substrate surface.

If the half dicing using the dicing blade 300 is finished, the expansion tape 190 is attached onto the rear surface of the substrate, and then, the dicing tape 160 is irradiated with ultraviolet rays 180. The adhesive layer 164 irradiated with the ultraviolet rays is cured, and the viscosity is lost (see FIG. 3C). Then, the dicing tape is separated from the front surface of the substrate. FIG. 6 is a cross-sectional view illustrating the remaining of the adhesive layer when the dicing tape is separated. The expansion tape 190 attached to the rear surface of the substrate includes a tape base material 192 and an adhesive layer 194 stacked thereon, and the cut semiconductor pieces are held by the adhesive layer 194.

When the dicing tape 160 is separated from the front surface of the substrate, an adhesive layer 164a that enters the fine groove 140 advances to a deep position, and thus, a part thereof may not be sufficiently irradiated with the ultraviolet rays so as to be uncured. Since the uncured adhesive layer 164 has viscosity, when the adhesive layer 164 is separated from the front surface of the substrate, the uncured adhesive layer 164a may be cut, so that the adhesive layer 164a may remain inside the fine groove 140, or may be re-attached onto the front surface of the substrate so as to remain. Further, even though the adhesive layer 164a is in a cured state, since the adhesive layer 164a deeply intrudes into the narrow fine groove, the adhesive layer 164a may be broken due to stress during separation to remain. If a remaining adhesive layer 164b is re-attached onto the front surface of the light emitting device, it causes reduction of the light intensity of the light emitting device. Thus, the light emitting device becomes a defective product, which results in reduction of a yield rate. Further, even in a semiconductor chip other than the light emitting device, as the adhesive layer 164b remains, other negative effects are expected. For example, it may be determined that the chip is defective by visual inspection or the like. Thus, when the dicing tape is separated, it is not preferable that the adhesive layers 164a and 164b remain on the front surface of the substrate. In the present embodiment, by changing the shape of the fine groove formed on the front surface of the substrate into the forward tapered shape as described later, the adhesive layer is suppressed from remaining in the fine groove, on the front surface of the substrate, or the like when the dicing tape is separated.

When the plural light emitting devices 100 are formed in a mesa shape, each light emitting device 100 forms a convex portion, and a space between the light emitting devices 100 forms a concave portion. In many cases, the fine groove 140 is formed in the concave portion. In such a configuration, a configuration in which the cutting water stream mixed with chips does not intrude into the front surface side of the substrate by attaching the adhesive layer 164 to follow an inlet portion of the fine groove 140 formed in the concave portion in addition to the convex portion may be considered. Here, in order to allow the adhesive layer 164 to follow the inlet portion of the fine groove 140, a dicing tape having the adhesive layer 164 of a sufficient thickness is necessary, and thus, the adhesive layer 164 easily and deeply enters the fine groove 140. Accordingly, in such a condition that the adhesive layer 164 easily and deeply enters the fine groove 140, by applying the fine groove having the forward tapered shape of the present embodiment which is to be described later, it is possible to achieve a high effect against the remaining of the adhesive layer 164.

Further, when the vertical fine groove is formed from the front surface of the semiconductor substrate, and when the adhesive layer 164 intrudes more deeply than the distance of the groove width of the fine groove, that is, when the shape of the adhesive layer 164a in the fine groove, of the adhesive layer 164, is longitudinally long, it is considered that the adhesive layer 164a is easily broken due to stress applied to a root portion of the adhesive layer 164a in the fine groove, when the adhesive layer 164 is separated, to be easily remained therein, compared with a case where the shape is not longitudinally long. Accordingly, in a manufacturing condition such as the width of the fine groove or the thickness of the adhesive layer 164 in which the shape of the adhesive layer 164a in the fine groove is longitudinally long when the forward tapered shape of the present embodiment is not applied, y applying the fine groove having the forward tapered shape of the present embodiment which is to be described later, it is possible to achieve a high effect against the remaining of the adhesive layer 164.

Figure 7A:
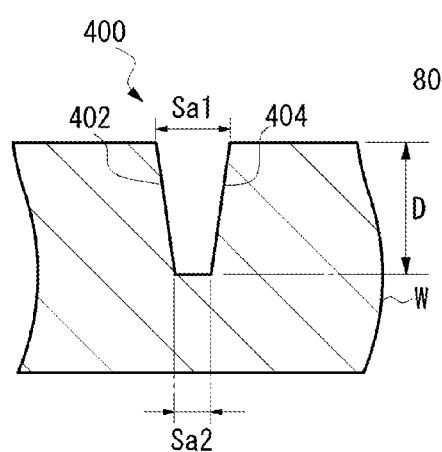

Next, a preferred shape of a fine groove according to an embodiment of the invention will be described. FIG. 7A is a cross-sectional view illustrating a first preferred shape of a fine groove according to the present embodiment, and FIG. 7B is a diagram illustrating infrared ray irradiation to an adhesive layer that enters the fine groove shown in FIG. 7A.

As shown in FIG. 7A, a fine groove 400 of the present embodiment includes side walls 402 and 404 that face each other in which an opening width Sa1 on the front surface of the substrate is inclined to become narrow from the opening width Sa1 to a width Sa2 (Sa1>Sa2) of a bottom portion at a depth D (such inclination is referred to as a forward tapered shape). In other words, the fine groove 400 has a shape in which the width is gradually narrowed from the opening width Sa1 on the front surface of the semiconductor substrate W to the depth D. The opening width Sa1 is several micrometers to ten and several micrometers, for example. Further, the depth D is a depth at least greater than a depth where a circuit such as a light emitting device is formed, which is a depth where the step portion 800 formed by the difference between the width of the groove 170 and the width of the fine groove 400 is not broken when the groove 170 is formed on the rear surface side. When the fine groove 400 is excessively shallow, the step portion 800 may be broken due to stress from the dicing blade 300 when the groove 170 is formed from the rear surface side, and thus, it is necessary that the fine groove 400 be formed to have a depth where the breakage does not occur. On the other hand, when the fine groove 400 is excessively deep, the strength of the semiconductor substrate is weakened due to the deep groove, and thus, it is difficult to handle the semiconductor substrate W in a process subsequent to the formation of the fine groove 140 compared with a case where the fine groove 140 is shallow. It is preferable that the fine groove 140 is not formed more deeply than necessary. In a semiconductor substrate having a general thickness, such a depth D is about 10 µm to about 100 µm, for example. Further, the fine groove 400 is preferably formed by anisotropic dry etching, and the inclination angle of the side walls 402 and 404 may be appropriately selected by changing the shape of a photoresist, an etching condition, or the like.

Figure 7B:
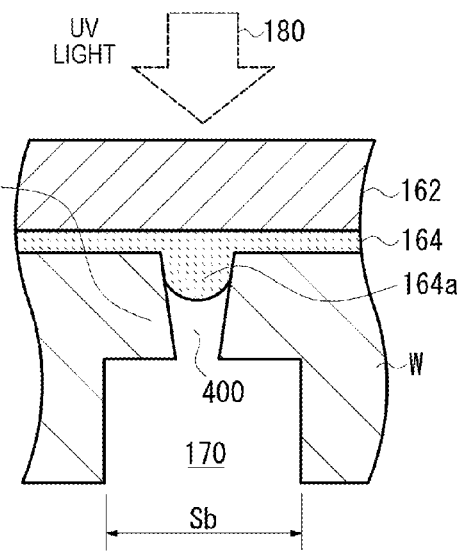

As shown in FIG. 7B, the groove 170 having the kerf width Sb is formed by the cutting using the dicing blade 300, so that the groove 170 is connected to the fine groove 400. The width of the groove 170 (kerf width Sb) is about 20 µm to about 60 µm, for example. Due to stress based on pressure or vibration from the dicing blade 300, a part of the adhesive layer 164 enters the fine groove 400 having the forward tapered shape, and after the expansion tape is attached, the dicing tape 160 is irradiated with the infrared rays 180 from the front surface side of the substrate. Here, since the fine groove 400 is processed in the forward tapered shape, the infrared rays 180 sufficiently irradiate the adhesive layer 164a inside the fine groove 400 without being blocked by the semiconductor substrate W, so that the adhesive layer 164a inside the fine groove 400 is easily cured. As a result, when the dicing tape 160 is separated from the front surface of the substrate, even though the opening width of the fine groove 400 is the same, the adhesive layer 164a inside the fine groove 400 loses the viscosity compared with a case in which the fine groove 400 has a vertical shape. Thus, the separation from the front surface of the substrate and the fine groove 400 becomes easy, and the re-attachment of the viscosity to the front surface of the substrate is suppressed. Further, in the forward tapered shape of the fine groove 400, since the groove shape is inclined, even when the adhesive layer 164a that enters the fine groove 400 is not cured, it is easy to extract the adhesive layer 164a, to thereby promote the separation of the adhesive layer 164a.

Figure 7C:
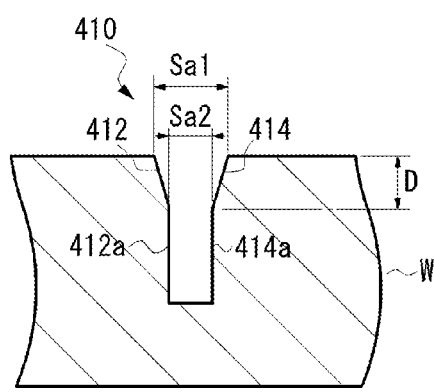

FIG. 7C is a cross-sectional view illustrating a second preferred shape of a fine groove according to the present embodiment. A second preferred fine groove 410 includes a groove portion of opposite side walls 412 and 414 that are inclined in a forward direction from the opening width Sa1 on the front surface of the substrate to a middle width Sa2 at a depth D, and a groove portion of opposite side walls 412a and 414a that are approximately vertical from the width Sa2 to a bottom portion thereof. It is preferable that the depth D of the groove portion inclined by the side walls 412 and 414 is greater than the depth where the adhesive layer 164 enters at a time point when the dicing tape 160 is attached. Since the width of the groove portion that is deeper than the depth D is narrower than the groove width of the forward tapered shape, a change rate of the groove width due to vibration or stress of the dicing blade is large compared with the groove portion of the forward tapered shape. Accordingly, when the adhesive layer 164 intrudes into the groove portion that is already deeper than the depth D at the time point when the dicing tape 160 is attached, the adhesive layer 164 may intrude more deeply into the groove due to the vibration or the stress of the dicing blade. Accordingly, it is preferable that the depth D is greater than the depth at where the adhesive layer 164 enters in a state where the dicing tape 160 is attached. Preferably, the depth D is 10 μm or more.

Further, it is preferable that the depth D is a depth where a state where the adhesive layer 164 does not intrude into the groove portion that is deeper than the depth D is maintained after the groove on the rear surface side is formed by the dicing blade. This is because if the adhesive layer 164 intrudes into the groove portion that is deeper than the depth D, the adhesive layer 164 easily remains therein during separation. Here, other conditions such as the entire depth of the fine groove are the same as in FIG. 7A.

Here, when the fine groove is deeply formed by only the forward tapered shape as shown in FIG. 7A, it is necessary to enlarge the opening width Sa1. Further, when the fine groove 400 is deeply formed by only the forward tapered shape in a state where the opening width Sa1 is narrow, the taper angle becomes rapid, and thus, the adhesive layer 164 easily remains in the fine groove 400. On the other hand, in the shape shown in FIG. 7C, the fine groove having a desired depth is easily formed while maintaining the opening width Sa1 to be a width where the adhesive layer does not easily remain in the fine groove. When the fine groove having the desired depth can be formed, the breakage of the step portion is suppressed when the groove 170 having the width greater than the width of the fine groove 410 is formed from the rear surface side, compared with a case where the depth of the fine groove is narrow.

In FIG. 7C, the groove portion that is approximately vertical from a lowermost part of the forward tapered shape toward the rear surface of the substrate and is not changed in its width is shown, but the shape is not essentially vertical, and may be a shape that is not narrower than the width of the lowermost part of the forward tapered shape and is directed toward the rear surface of the semiconductor substrate. With such a shape, even though the opening width of the fine groove is not enlarged compared with the configuration shown in FIG. 7A, the fine groove 410 having the desired depth is easily formed. Further, in FIG. 7C, an angle of the sidewall is abruptly changed at the depth D. In other words, the sidewall of the fine groove 410 has an edge portion at the depth D. However, it is preferable that the sidewall of the fine groove 410 does not have the edge portion but has a smoothly curved sidewall. This enables the adhesive layer 164a to be extracted more smoothly from the fine groove 410 even if the adhesive layer 164a enters more deeply than the depth D.

Further, when the fine groove that is vertical from the front surface of the semiconductor substrate is formed, and when the adhesive layer 164 intrudes more deeply than the distance of the groove width of the fine groove, that is, when the shape of the adhesive layer 164a in the fine groove, of the adhesive layer 164, is longitudinally long, the adhesive layer 164a is easily broken due to stress applied to a root portion of the adhesive layer 164a in the fine groove, when the adhesive layer 164 is separated, to easily remain therein, compared with a case where the shape is not longitudinally long. Accordingly, in a manufacturing condition such as the width of the fine groove or the thickness of the adhesive layer 164 in which the shape of the adhesive layer 164a in the fine groove is longitudinally long when the vertical shape of the fine groove is formed, it is preferable that the inlet portion of the fine groove is formed in the forward tapered shape as shown in FIG. 7C. That is, when the groove width of the groove portion positioned below the groove portion having the forward tapered shape is a width that is narrower than the depth where the adhesive layer enters assuming that the entirety of the fine groove 410 is formed with this groove width, if the inlet portion of the groove is formed in the forward tapered shape, it is possible to achieve a high effect against the remaining of the adhesive layer 164.

Figure 7D:
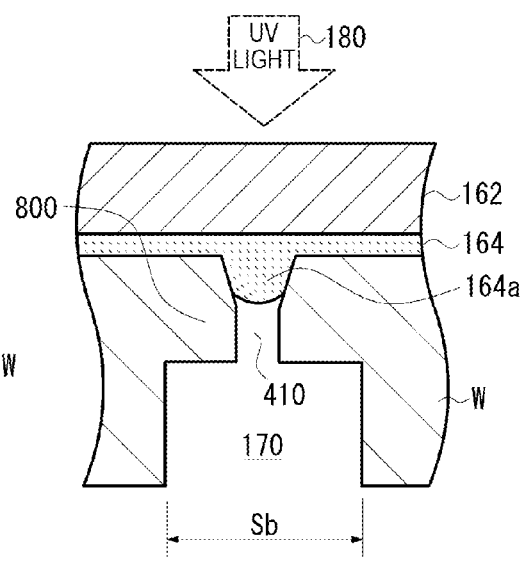

With respect to the fine groove shown in FIG. 7C, if the groove 170 of the kerf width Sb is formed by the cutting using the dicing blade 300, a shape in which the groove 170 is connected to the fine groove 410 is obtained, as shown in FIG. 7D. Similar to the case shown in FIG. 7B, the adhesive layer 164a that is a part of the adhesive layer 164 enters the fine groove 410, but if the depth D of the groove portion (side walls 412 and 414) having the forward tapered shape, of the fine groove 410, is formed to be greater than the depth where the adhesive layer 164a enters, the adhesive layer 164a inside the fine groove 410 is sufficiently irradiated with infrared rays and is easily cured. Thus, the adhesive layer is suppressed from remaining in the fine groove 410 or on the front surface of the substrate during separation of the dicing tape. Further, since the side walls of the fine groove 410 are inclined, even when the adhesive layer 164a that enters the fine groove 410 is not cured, it is easy to extract the adhesive layer 164a, to thereby promote separation of the adhesive layer 164a.

Figure 8A:
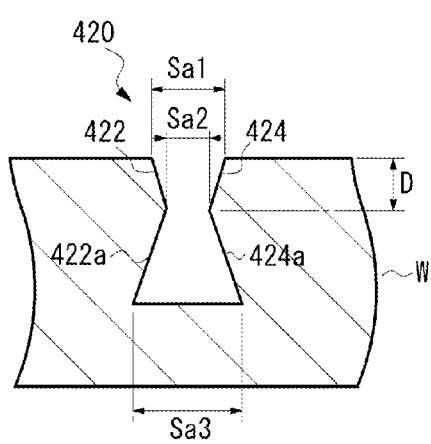

FIG. 8A is a cross-sectional view illustrating a third preferred shape of a fine groove according to the present embodiment. As shown in FIG. 8A, a third preferred fine groove 420 has a configuration in which the groove portion having the vertical shape, of the second preferred fine groove 410, is changed into a groove portion having a reverse tapered shape. That is, the fine groove 420 includes a groove portion of opposite side walls 422 and 424 that are inclined in the forward direction from the opening width Sa1 on the front surface of the substrate to the middle width Sa2 at the depth D, and a groove portion of opposite side walls 422a and 424a that are reversely inclined from the width Sa2 to a width Sa3 of a bottom portion thereof. Here, the relationship of Sa1>Sa2 and Sa3>Sa2 is established. The relationship between Sa1 and Sa3 is arbitrary, but is preferably Sa3>Sa1. Further, conditions such as the depth of the fine groove are the same as in FIGS. 7A to 7D. When forming the groove 170 by the dicing blade 300, in order to reliably connect the fine groove 420 and the groove 170, as shown in FIG. 8A, the tip portion of the dicing blade 300 performs the cutting up to a position close to the front surface of the semiconductor substrate W with reference to the lowermost part of the fine groove 420. In this case, in view of the relation of stress from the dicing blade 300 which is to be described later, it is preferable that the width of the fine groove 420 in a boundary portion between the fine groove 420 and the groove 170 is greater than the width of the fine groove 420 at the depth D.

Figure 8B:
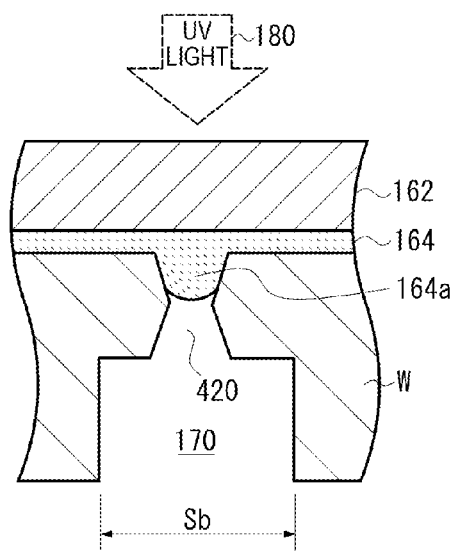

As shown in FIG. 8B, during cutting using the dicing blade 300, the adhesive layer 164a that is a part of the adhesive layer 164 enters the fine groove 420, but if the fine groove 420 is formed to have the groove portion (side walls 422 and 424) having the forward tapered shape of the depth D greater than the depth where the adhesive layer 164a enters the fine groove 420, the adhesive layer 164a inside the fine groove 420 is sufficiently irradiated with infrared rays and is easily cured. Thus, the adhesive layer is suppressed from remaining in the fine groove 420 or on the front surface of the substrate during separation of the dicing tape. Further, since the side walls of the fine groove 420 are inclined, even when the adhesive layer 164a that enters the fine groove 420 is not cured, it is easy to extract the adhesive layer 164a, to thereby promote separation of the adhesive layer 164a. Further, in FIG. 8A, an angle of the sidewall is abruptly changed at the depth D. In other words, the sidewall of the fine groove 410 has an edge portion at the depth D. However, it is preferable that the sidewall of the fine groove 420 does not have the edge portion but has a smoothly curved sidewall. This enables the adhesive layer 164a to be extracted more smoothly from the fine groove 420 even if the adhesive layer 164a enters more deeply than the depth D.

According to the present embodiment, since the fine grooves 400, 410, and 420 are formed to have at least the groove portion having the forward tapered shape in which the opening width on the front surface of the substrate is narrowed toward the bottom portion, even when the adhesive layer of the dicing tape enters the fine groove, the entirety of the adhesive layer inside the fine groove is easily irradiated with infrared rays to be cured, so that the viscosity is easily lost, compared with a case where the forward tapered shape is not provided. Further, due to the forward tapered shape, the adhesive layer is suppressed from being cut during separation of the dicing tape, compared with a case where the forward tapered shape is not provided, and thus, the adhesive layer is easily separated integrally from the fine groove or the front surface of the substrate.

In FIGS. 7A to 7D and FIGS. 8A and 8B, characteristics of the fine groove are schematically shown for ease of understanding, but it should be noted that the side surfaces or the like of the fine groove that is actually formed may include steps or unevenness or may be formed in a curved shape. For example, the fine groove on the front surface side is shown to have the shape in which the width is linearly and gradually narrowed, but the linear shape is not essential. As long as the shape is a shape in which the width is gradually narrowed, a shape having a curved line or the like may be used. Further, for example, a shape in which the width is gradually narrowed in a step form may be used. However, the shape in which the width is gradually narrowed in a continuous manner is more preferable than the shape in which the width is gradually narrowed in a step form, from the viewpoint of suppressing the remaining of the adhesive layer.

Further, in all the drawings of FIGS. 7A to 7D and FIGS. 8A and 8B, a configuration in which the opening width Sa1 of the front surface of the substrate is narrower than the width of the groove 170 is shown. This is because when the configuration in which the opening width Sa1 of the front surface of the substrate is narrower than the width of the groove 170, the number of acquired semiconductor pieces can increase compared with a case where the full dicing is performed according to the width of the groove 170. Here, in general, in order to increase the number of acquired semiconductor pieces, it is preferable that the groove on the front surface side is not formed by isotropic etching or a dicing blade but is formed by anisotropic dry etching capable of easily forming a groove having a narrow width and a vertical shape. However, if the vertical groove shape having the narrow width is merely formed using the anisotropic dry etching, this is not preferable from the viewpoint of the remaining of the adhesive layer. On the other hand, when considering the remaining of the adhesive layer, it is preferable that the groove on the front surface side is not formed by the anisotropic dry etching that forms the groove having the narrow width and the vertical shape but is formed by the isotropic etching or the like that does not form the opening of the fine groove in the vertical shape. However, in the isotropic etching, a deep groove having a narrow width is not easily formed. Thus, in the present embodiment, by forming the fine groove having the shape shown in FIGS. 7A to 7D and FIGS. 8A and 8B by even using the anisotropic dry etching, both of the increase of the number of acquired semiconductor pieces and the suppression of the remaining of the adhesive layer are achieved.

Figure 9A:
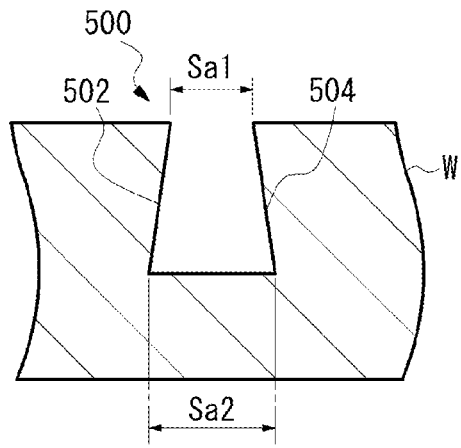
Figure 9B:
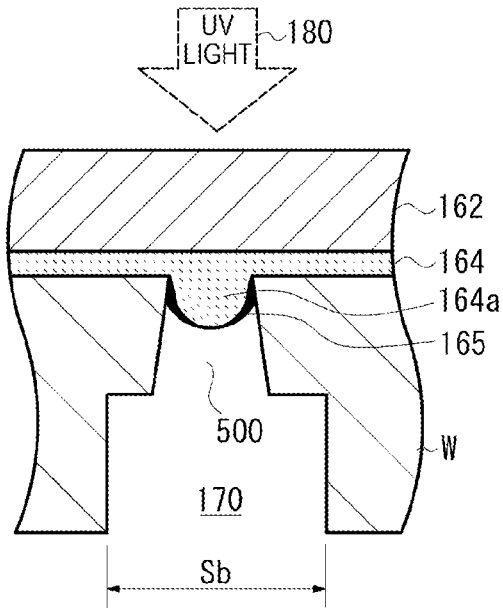

FIGS. 9A and 9B are diagrams illustrating a comparative example in which a fine groove is processed in a reverse tapered shape. As shown in FIG. 9A, a fine groove 500 is processed in a groove having a so-called reverse tapered shape, which includes opposite side walls 502 and 504 that are inclined so that the width Sa2 at the bottom portion thereof is greater than the opening width Sa1. As shown in FIG. 9B, when the adhesive layer 164a that is a part of the adhesive layer 164 enters the fine groove 500 having the reverse tapered shape, since the opening of the opening width Sa1 is narrow, a part of the infrared rays 180 are easily blocked by the semiconductor substrate W. Thus, an adhesive layer 165 (painted-out portion in the figure) in a peripheral part of the adhesive layer 164a is not sufficiently irradiated with the infrared rays, and thus, there is a high possibility that the adhesive layer 165 that is not reliably cured easily remains. For this reason, when separating the adhesive layer 164, the adhesive layer 165 having viscosity is easily cut, so that the adhesive layer 165 remains inside the fine groove, or is re-attached onto the front surface of the substrate, compared with the case of the forward tapered shape. Further, due to the reverse tapered shape, the cured adhesive layer 164 that enters the fine groove 500 is not easily extracted.

Figure 9C:
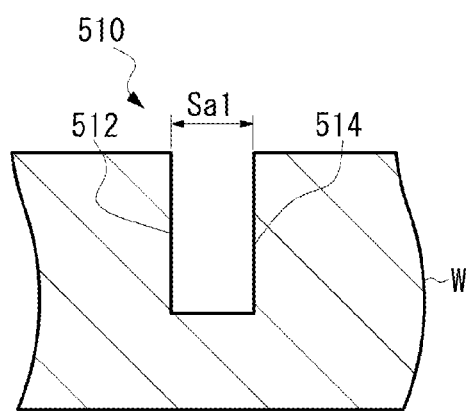
Figure 9D:
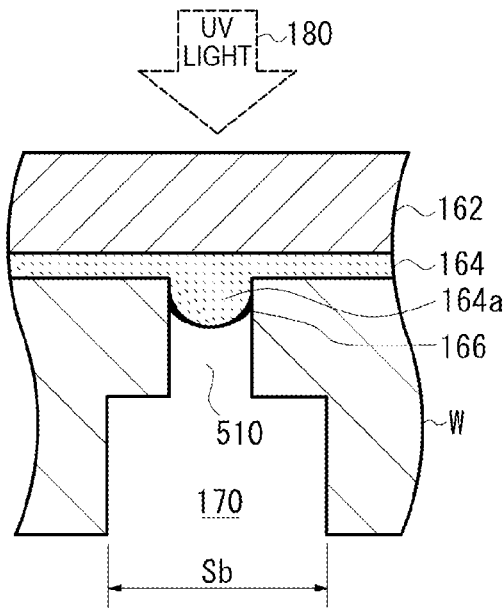

FIGS. 9C and 9D are diagrams illustrating a comparative example in which a fine groove is processed in an approximately vertical shape. As shown in FIG. 9C, a fine groove 510 is processed in a groove having a so-called vertical shape, which includes opposite side walls 512 and 514 in which the opening width Sa1 on the front surface of the substrate is vertical. As shown in FIG. 9D, since the adhesive layer 164a entering the fine groove 510 having the vertical shape enters deeply inside compared with the width Sa1 of the fine groove, the entirety of the adhesive layer 164a is not sufficiently irradiated with the infrared rays 180, and thus, a partial adhesive layer 166 in a peripheral part thereof is easily uncured compared with the case of the forward tapered shape. Although the uncured adhesive layer 166 is less in amount than the adhesive layer 165 in the reverse tapered shape shown in FIG. 9A, the adhesive layer 166 may remain in the fine groove 510 or on the front surface of the substrate or may be re-attached thereto during separation of the dicing tape.

Figure 10A:
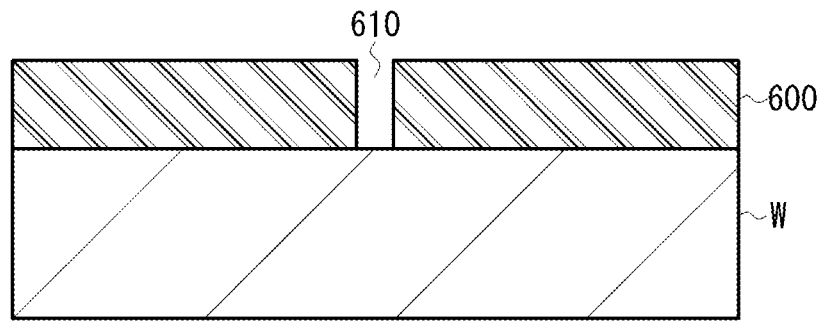
FIGS. 10A to 10D are cross-sectional views schematically illustrating processes of a first fine groove manufacturing method according to an embodiment of the invention.

Next, a first manufacturing method of the fine groove of the present embodiment will be described. FIGS. 10A to 10D are cross-sectional views illustrating processes of a manufacturing method of the fine groove shown in FIG. 7A. As shown in FIG. 10A, a photoresist 600 is coated on a front surface of a semiconductor substrate W (GaAs substrate) on which plural light emitting devices are formed. The photoresist 600 is an i-line resist having a viscosity of 100 cpi, and is formed to have a thickness of about several micrometers. An opening 610 is formed in the photoresist 600 using a known photolithography process, for example, using an i-line stepper and a developer of TMAH 2.38%. The opening 610 is formed to expose the cutting region 120 as described in FIG. 2A, and the width of the opening 610 is approximately uniform. That is, the opening 610 has side walls that are approximately vertical.

Figure 10B:
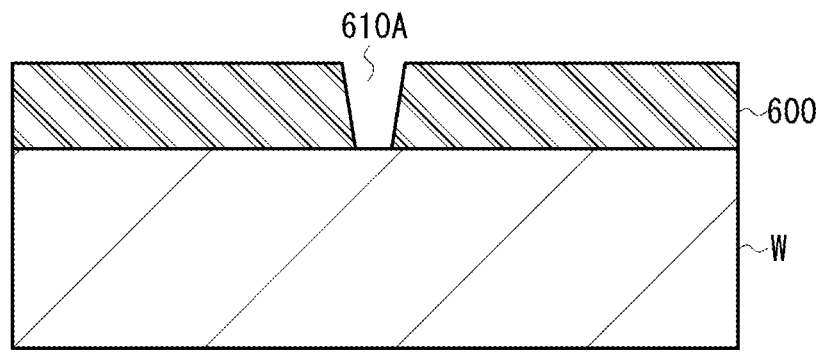

Next, as shown in FIG. 10B, the photoresist 600 is baked at a high temperature so that the photoresist 600 is softened, and is processed into an opening 610A having side surfaces of a forward tapered shape. Specifically, the baking temperature and the baking time are adjusted to form the shape of the opening of the photoresist to become a shape in which the width is gradually enlarged from the front surface of the substrate to an upper surface of the photoresist. That is, the opening is formed in a reverse tapered shape when seen from the front surface of the substrate. As the conditions, for example, the baking temperature is 110° C., and the baking time is 2 minutes. Any other method capable of forming the photoresist having the shape in which the width is gradually enlarged from the front surface of the substrate to the upper surface of the photoresist, such as a method for using a gray mask during exposure, may be used.

Figure 10C:
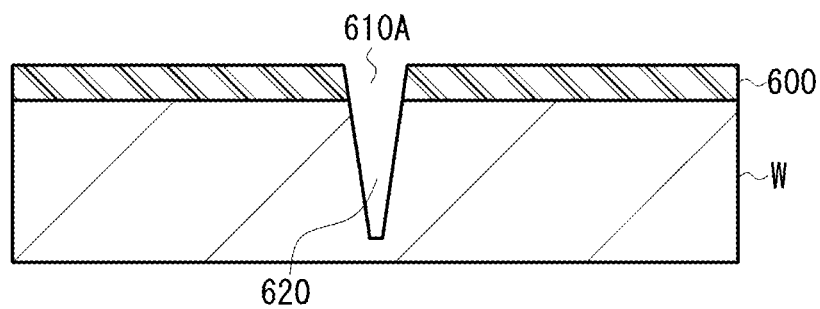
Figure 10D:
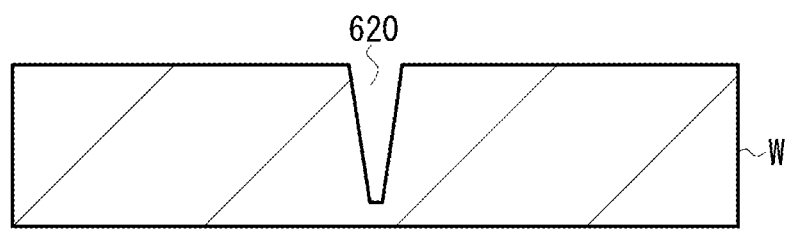

Next, as shown in FIG. 10C, anisotropic dry etching is performed with respect to the semiconductor substrate W using a resist pattern of the photoresist 600 in which the forward tapered shape opening 610A is formed as an etching mask. In a preferred embodiment, inductive coupled plasma (ICP) is used as a reactive ion etching (RIE) apparatus. As an etching condition, for example, inductive coupled plasma (ICP) power is 500 W, bias power is 50 W, and pressure is 3 Pa. As etching gases, $Cl_2$ is 150 sccm, $BCl_3$ is 50 sccm, and $C_4F_8$ is 20 sccm. Further, a substrate temperature is 20° C. and an etching time is 40 minutes. With such etching, since a region that is gradually etched from a thin portion in the thickness of the resist having the opening of the reverse tapered shape toward a thick portion in the thickness thereof is enlarged in the transverse direction on the front surface of the substrate, a fine groove 620 having a forward tapered shape to which the shape of the opening 610A is transferred is formed. Then, the photoresist 600 is removed by oxygen ashing as shown in FIG. 10D.

Figure 11A:
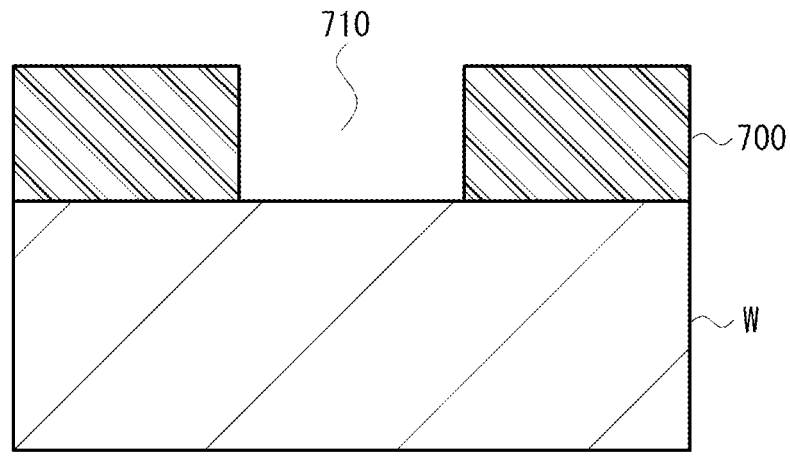
FIGS. 11A to 11C are cross-sectional views schematically illustrating processes of a second fine groove manufacturing method according to an embodiment of the invention.
Figure 11B:
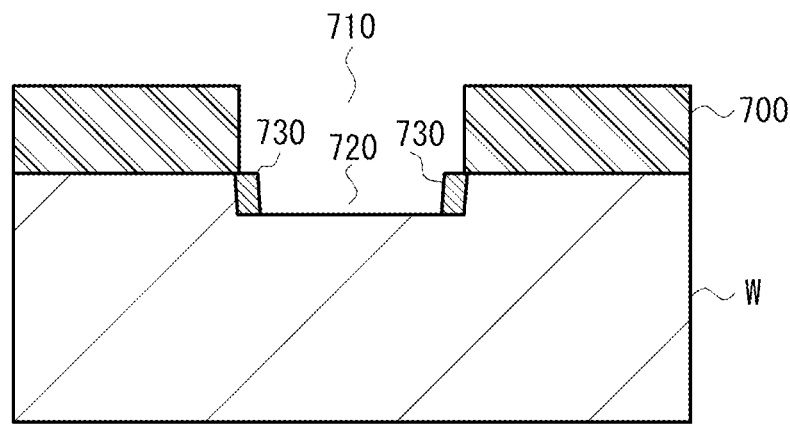
Figure 11C:
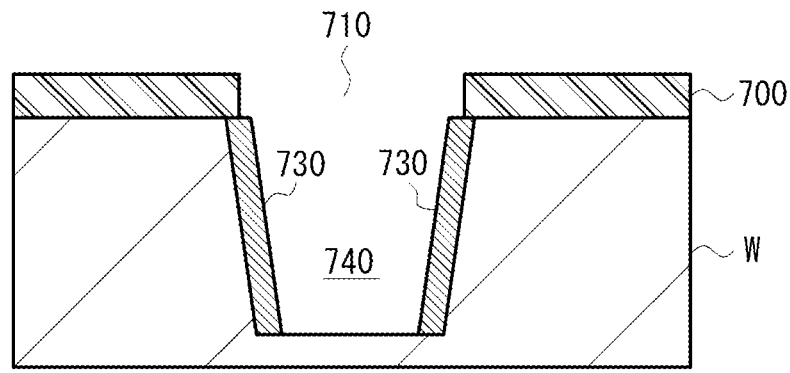

Next, a second manufacturing method of the fine groove of the present embodiment will be described. FIGS. 11A to 11C are cross-sectional views illustrating processes of another manufacturing method of the fine groove shown in FIG. 7A. As shown in FIG. 11A, a photoresist 700 is coated on a front surface of a semiconductor substrate W (GaAs substrate), and an opening 710 that exposes a cutting region is formed. This process is the same as the process of FIG. 10A, for example.

Next, as shown in FIG. 11B, anisotropic dry etching is performed with respect to the semiconductor substrate W using a resist pattern of the photoresist 700 in which the opening 710 is formed as an etching mask. Thus, a first groove portion 720 is formed on the front surface of the substrate. In a preferred embodiment, inductive coupled plasma (ICP) is used as a reactive ion etching (RIE) apparatus. As an etching condition, for example, inductive coupled plasma (ICP) power is 500 W, bias power is 50 W, and pressure is 3 Pa. As etching gases, $Cl_2$ is 150 sccm, $BCl_3$ is 50 sccm, and $C_4F_8$ is 50 sccm. As known in the art, by adding a CF-based gas, a protective film 730 is formed on the side walls at the same time with etching. Radicals and ions are generated by reactive gas plasma. The side walls of the first groove portion 720 are attacked by only the radicals, and the bottom portion thereof is attacked by the radicals and ions to be easily etched, so that anisotropic etching is achieved.

By optimizing the etching conditions such as an output of the etching apparatus, the flow rates of gases, and the time, the protective film 730 formed on the side wall is adjusted to have an appropriate thickness. If the protective film 730 is adjusted to be thin, a groove having a vertical shape or a groove having a reverse tapered shape is formed, whereas if the protective film 730 is adjusted to be thick, a fine groove 740 having a forward tapered shape as shown in FIG. 11C can be formed. As an example, if the flow rate of the CF-based gas which is a side wall protective film forming gas included in the etching gases increases, the protective film 730 becomes thick, which easily forms the forward tapered shape.

Figure 12A:
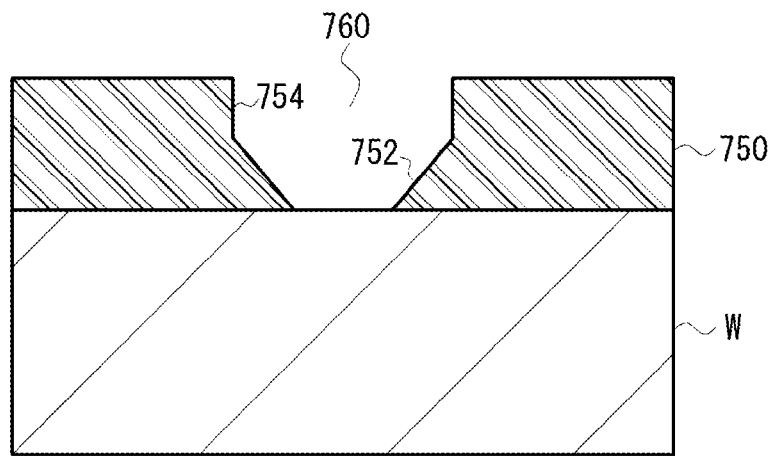
FIGS. 12A to 12C are cross-sectional views schematically illustrating processes of a third fine groove manufacturing method according to an embodiment of the invention.
Figure 12B:
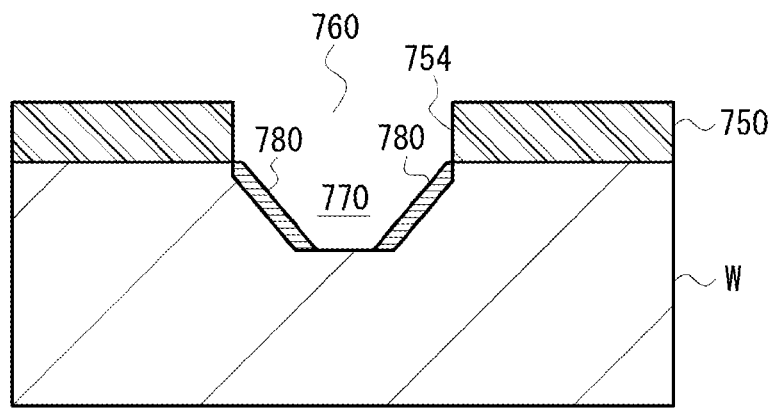
Figure 12C:
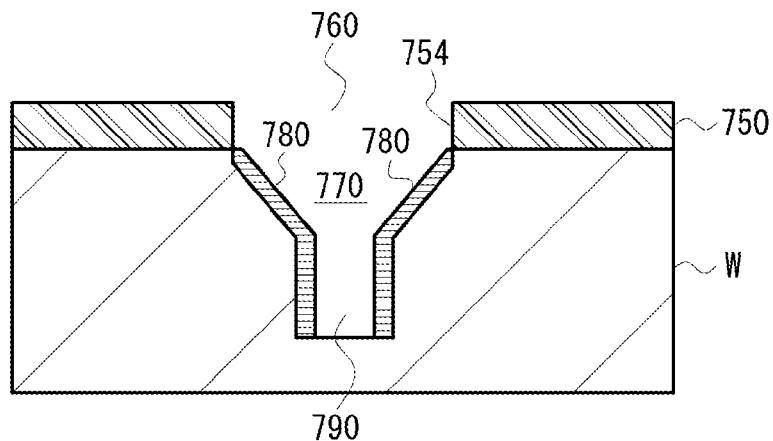

Next, a third manufacturing method of the fine groove of the present embodiment will be described. FIGS. 12A to 12C are cross-sectional views illustrating processes of a manufacturing method of the fine groove shown in FIG. 7C. In this manufacturing method, as shown in FIG. 12A, the shape of a photoresist 750 formed on a semiconductor substrate W (GaAs substrate) is different from that of the photoresist shown in FIGS. 10A to 10D or FIGS. 11A to 11C. That is, an opening 760 of the photoresist 750 includes a first photoresist portion 752 in which the width is gradually enlarged from the front surface of the semiconductor substrate W in an upward direction, and a second photoresist portion 754 that extends from an upper end of the first photoresist portion 752 in the upward direction at an angle smaller than an angle at which the width of the opening in the first photoresist portion 752 increases. Here, the "upward direction" represents an upward direction when the front surface of the semiconductor substrate is directed upward.

The photoresist 750 having such a shape is formed using a gray mask, for example. First, the photoresist is coated on the semiconductor substrate W (GaAs substrate). Then, the amount of exposure is adjusted to be different between a central portion and a peripheral portion of a region to be opened using the gray mask when forming the opening that exposes the cutting region. Specifically, a specific light intensity is set for exposure in the central portion of the region to be opened, and the amount of exposure gradually decreases from the outer periphery of the central portion toward the outer periphery of the region to be opened. Further, the exposure is not performed in a region outside the peripheral portion in which the opening is not formed. When a negative type photoresist is used, the amount of exposure may be reversed. Further, any method capable of consequently forming the photoresist that includes the first photoresist portion 752 in which the width is gradually enlarged from the front surface of the semiconductor substrate W in the upward direction and the second photoresist portion 754 that extends from the upper end of the first photoresist portion 752 in the upward direction with reference to the angle of the first photoresist portion 752, such as a method using stress generated according to the formation of the opening or other actions, may be used. In any method, the method may not include baking after the photoresist is formed, and may be performed in a range where a desired shape is not collapsed.

Next, as shown in FIG. 12B, anisotropic dry etching is performed with respect to the semiconductor substrate W using a resist pattern of the photoresist 750 in which the opening 760 is formed as an etching mask. As an etching condition, for example, the same etching condition as in the first manufacturing method or the second manufacturing method of the fine groove according to the present embodiment may be applied. Here, since the resist pattern of the photoresist 750 has the first photoresist portion 752 having the opening of the reverse tapered shape that is formed from the front surface of the substrate in the upward direction, a region that is gradually etched from a thin portion in the thickness of the resist having the opening of the reverse tapered shape toward a thick portion in the thickness thereof is enlarged in the transverse direction, and as shown in FIG. 12B, a first groove portion 770 (fine groove) having a forward tapered shape to which the shape of the opening 760 of the photoresist is transferred is formed. Here, a protective film 780 is formed on the side walls at the same time with etching by the CF-based gas included in the etching gases, similar to FIG. 11B.

Then, the etching is further performed. Here, since only the second photoresist portion 754 that extends from the upper surface of the semiconductor substrate W in the vertical direction remains, the groove having the forward tapered shape shown in FIG. 12B is not continuously formed with the angle being maintained, and as shown in FIG. 12C, a second groove portion 790 that extends downward is formed while maintaining the forward tapered shape in an input portion of the first groove portion 770. In the first manufacturing method or the third manufacturing method of the fine groove according to the embodiment, since the photoresist having the opening in which the width is gradually enlarged from the front surface of the semiconductor substrate W in the upward direction is used, even when the etching condition is not optimized to form the groove of the forward tapered shape like the second manufacturing method of the fine groove, the forward tapered shape groove is easily formed.

According to the above-mentioned processes, a fine groove that includes the first groove portion 770 in which the width is gradually narrowed from the front surface of the semiconductor substrate W toward the rear surface thereof and the second groove portion 790 that is directed to the rear surface of the semiconductor substrate W from the lowermost part of the first groove portion 770 without being narrowed compared with the width of the lowermost part can be formed as shown in FIG. 12C. The second photoresist portion 754 may be formed in a shape other than the shape that vertically extends in the upward direction. For example, the vertical shape is not essential as long as the shape is a shape that extends in the upward direction at an angle smaller than the angle at which the width of the opening in the first photoresist portion 752 is enlarged. With such a shape, compared with the configuration of the fine groove having only the forward tapered shape as shown in FIG. 7A, a fine groove having a desired depth is easily formed while maintaining the input portion of the fine groove in the forward tapered shape.

Next, a fourth manufacturing method of the fine groove shown in FIG. 8A will be described as a fourth manufacturing method of the fine groove of the present embodiment. When the fine groove that includes the groove portion having the forward tapered shape and the groove portion having the reverse tapered shape as shown in FIG. 8A is formed, first, the groove portion of the forward tapered shape is formed using the first, second or third manufacturing method of the fine groove according to the present embodiment. Then, the etching condition is changed to an etching condition capable of widely forming the groove width compared with the etching condition for forming the groove portion having the forward tapered shape, that is, an etching condition having a strong etching strength in the side wall direction of the groove to continue the etching. By changing the etching condition to the etching condition capable of widely forming the groove width, the groove portion that is already formed in the forward tapered shape is suppressed from being enlarged in its groove width by the protective films formed on the side walls, and a groove portion having a wider width is formed in a lower part that communicates with the groove portion having the forward tapered shape to extend downward.

Here, in order to enlarge the groove width, the flow rate of $Cl_2$ which is an etching gas included in the etching gases may be increased, and the flow rate of $C_4F_8$ (CF-based gas) which is a gas for forming a side wall protective film may be decreased. This is achieved by changing at least one of the flow rates. That is, by changing the flow rate of at least one etching gas, the groove width may be changed. In other words, both of the time when the groove portion having the forward tapered shape is formed and the time when the groove portion having the reverse tapered shape is formed, while both of the side wall protection gas and the etching gas included in the etching gases are being supplied, each flow rate may be changed. Further, by setting such a flow rate in advance before the groove portion having the forward tapered shape is formed, the groove portion having the forward tapered shape and the groove portion having the reverse tapered shape can be formed by a series of continuous etching processes. Further, for example, by changing the output of the etching apparatus, the etching condition may be optimized so that the groove width is enlarged. Further, if the flow rate is not changed drastically, the fine groove 410 in FIG. 7C and the fine groove 420 in FIG. 8A do not have an edge portion in its sidewall at the depth D. This enables the adhesive layer 164a to be extracted more smoothly from the fine groove 410 and 420 even if the adhesive layer 164a enters more deeply than the depth D.

The etching method for transferring the above-mentioned resist shape and the etching method for forming the side wall protecting film are typical examples of the manufacturing method according to the present embodiment, and the manufacturing method of the fine groove according to the present embodiment is not limited to the manufacturing processes shown in FIG. 10A to FIG. 12C, and various combinations may be used. For example, in the first to third manufacturing methods of the fine groove according to the present embodiment, the etching condition may be changed, similar to the fourth manufacturing method of the fine groove according to the present embodiment. While the fine groove is being formed, by changing the etching condition to an etching condition having an etching strength in the side wall direction or the downward direction of the groove, stronger than the etching strength of the previously used etching, the angle of the forward tapered shape is narrowed from the middle of the fine groove, and thus, the side walls of the groove come close to a shape vertical to the substrate surface. In this way, by changing the etching condition, a fine groove that includes the groove portion having the shape shown in FIG. 7C or FIG. 8A, that is, the forward tapered shape, and the groove portion that extends from a lowermost part of the groove portion having the forward tapered shape toward the rear surface of the semiconductor substrate W without being narrowed compared with the width of the lowermost part. Further, when the shape shown in FIG. 7C or FIG. 8A is formed, the change of the etching condition is not only be performed once, but also may be performed plural times as necessary.

Figure 13A:
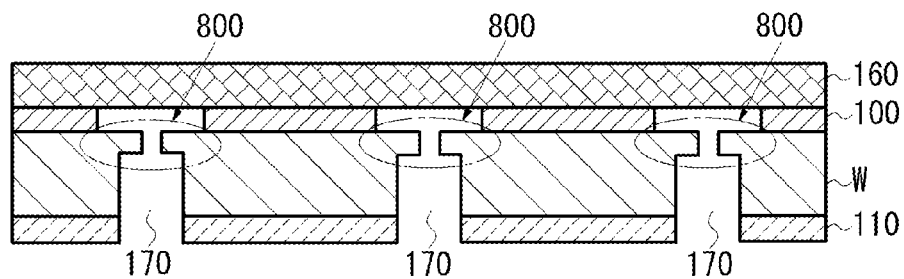
FIGS. 13A to 13C are cross-sectional views illustrating a step portion formed in a semiconductor chip.
Figure 13B:
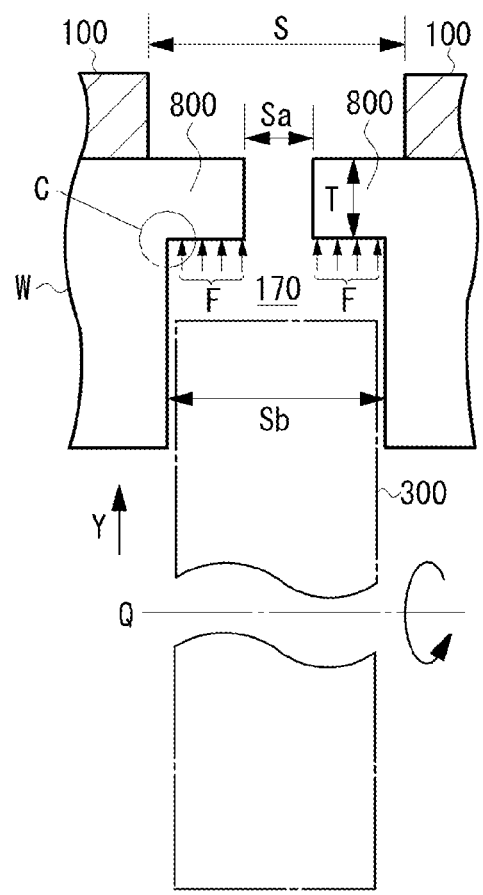
Figure 13C:
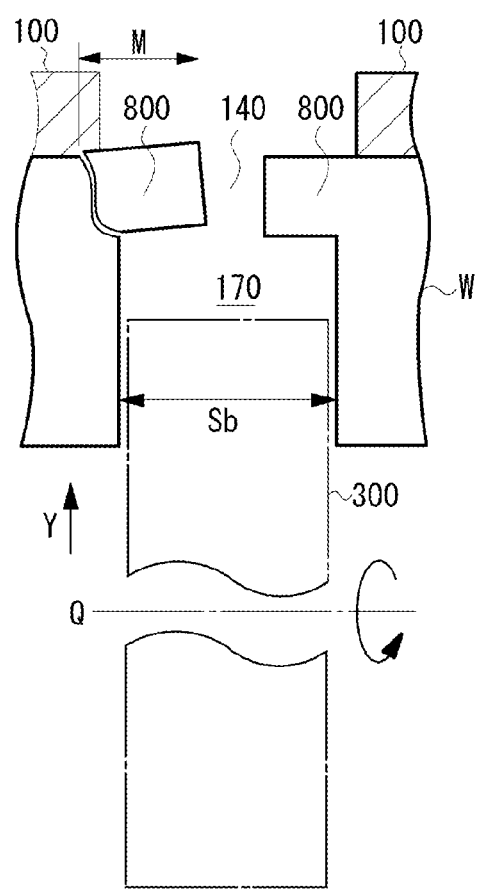

Next, additional effects of the fine groove 420 (FIG. 8) that includes the groove portion having the forward tapered shape and the groove portion having the reverse tapered shape according to the present embodiment will be described. FIG. 13A is a cross-sectional view when half dicing is performed by the dicing blade shown in FIG. 3B, FIG. 13B is an enlarged view of a step portion shown in FIG. 13A, and FIG. 13C is a diagram illustrating breakage of the step portion.

As described above, the plural light emitting devices 100 are formed on the front surface of the semiconductor substrate W, and the respective light emitting devices 100 are separated by the cutting regions 120 defined by the scribe line or the like with the space S. The fine groove 140 (vertical groove shown in FIG. 9C) having the width Sa is formed in the cutting region 120 by anisotropic dry etching. By cutting the semiconductor substrate W using the rotating dicing blade 300 having the kerf width Sb from the rear surface thereof, the groove 170 having approximately the same width as the kerf width Sb is formed on the semiconductor substrate W. Since the kerf width Sb is larger than the width Sa of the fine groove 140, when the groove 170 is formed, the step portion 800 having a cantilevered beam shape of the thickness T is formed in the cutting region 120 by the difference between the width Sb and the width Sa, in other words, the positional difference between the side surfaces of the fine groove 140 and the groove 170. If the center of the dicing blade 300 and the center of the fine groove 140 completely match each other, an extended length of the step portion 800 in the transverse direction is (Sb−Sa)/2.

When the cutting is performed by the dicing blade 300, as the flat surface of the tip portion of the dicing blade 300 presses the semiconductor substrate W in the Y direction, a force F is applied to the step portion 800, and thus, a stress concentrates on a corner C of the step portion 800. When the stress to the corner C exceeds a fracture stress of the wafer, as shown in FIG. 13C, breakage (fragment, crack, picking or the like) of the step portion 800 occurs. Particularly, since the compound semiconductor substrate made of GaAs or the like has a strength weaker than that of a silicon substrate, the breakage easily occurs in the step portion 800. If the breakage occurs in the step portion 800, it is necessary to secure a margin M for cutting the step portion 800. This means that the space S of the cutting region 120 should be the equal to or larger than the margin M, and thus, the number of acquired semiconductor pieces decreases. Accordingly, it is desirable to suppress the breakage of the step portion 800.

As factors having a high influence on the stress that causes the breakage of the step portion 800, the following three factors may be considered. The first factor is the shape of the tip portion of the dicing blade, the second factor is the thickness T of the step portion 800, and the third factor is the size of the step difference in the step portion 800, that is, a positional shift amount between the fine groove 140 and the groove 170 when the dicing blade 300 having a predetermined thickness is used. In order to reduce the stress to the step portion by the shape of the tip portion of the dicing blade, it is necessary to evaluate which shape is optimal. Further, if the thickness T of the step portion 800 can be increased, it is possible to increase the fracture strength of the corner of the step portion 800. However, when the fine groove 140 is formed by anisotropic dry etching, there is a restriction in the depth of the fine groove 140, and thus, it is difficult to increase the thickness T of the step portion 800 to a predetermined size or greater. Further, the positional shift between the center of the fine groove 140 and the center of the groove 170 is caused by the processing accuracy of the manufacturing apparatus such as the positioning accuracy of the dicing blade, in which a predetermined amount of variation occurs in the positional shift in mass production.

Since the fine groove 420 of the present embodiment as shown in FIG. 8A has the groove portion having the reverse tapered shape in the lower part of the groove portion having the forward tapered shape, in other words, since the width of the bottom portion of the fine groove is enlarged in the direction parallel to the front surface of the substrate, even when the positional shift occurs due to the processing accuracy of the manufacturing apparatus, it is possible to alleviate the stress to the step portion 800, and to suppress occurrence of the breakage of the step portion 800.

Figure 14A:
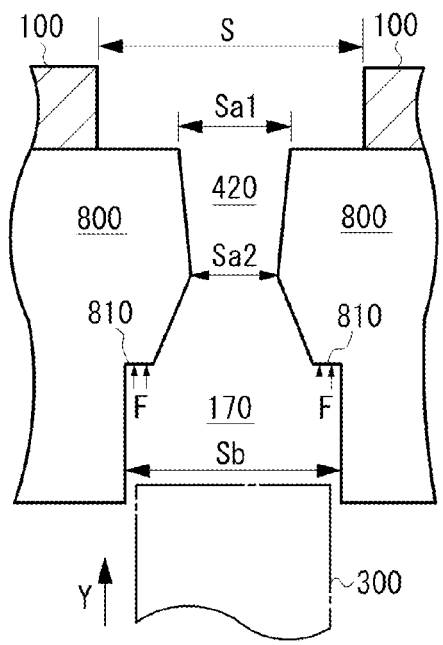
FIGS. 14A to 14D are diagrams illustrating suppression of breakage of a step portion when a substrate on which a fine groove according to an embodiment of the invention is formed is cut by a dicing blade.
Figure 14B:
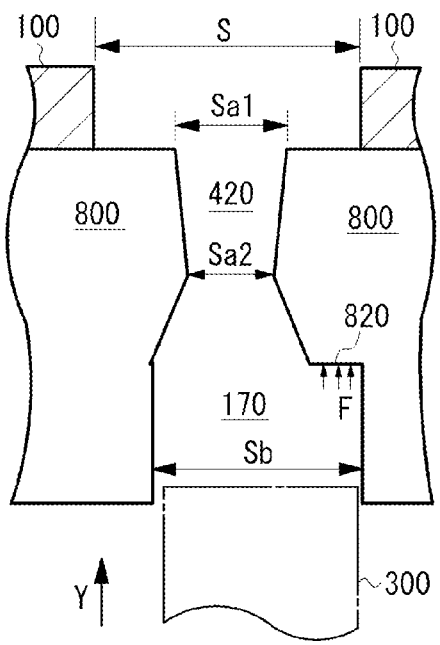

The stress alleviation of the step portion when the fine groove 420 is formed will be described. FIG. 14A shows a cutting example when the center of the dicing blade 300 and the center of the fine groove 420 match each other and the positional shift does not occur, and FIG. 14B shows a cutting example when the positional shift occurs. Further, the kerf width Sb due to the dicing blade 300 is larger than the width Sa3 (see FIGS. 8A and 8B) of the groove portion having the reverse tapered shape of the fine groove 420 (Sa3<Sb).

As shown in FIG. 14A, when the groove 170 is formed on the rear surface of the substrate by the dicing blade 300, the groove 170 is connected to the fine groove 420. In a preferred embodiment, the dicing blade 300 is positioned in the direction vertical to the semiconductor substrate W so that the tip portion thereof is positioned between the width Sa3 and the width Sa2 of the fine groove 420. In other words, the tip portion of the dicing blade 300 is positioned to reach at least the fine groove 420, but not to reach the depth that defines the width Sa2. When the positional shift of the dicing blade 300 is small, a step 810 that extends inside the groove 170 is formed at the boundary between the groove 170 and the fine groove 420. Since the width of the step 810 decreases compared with a case where the groove portion having the reverse tapered shape is not formed, the contact area between the tip portion of the dicing blade 300 and the step 810 is small, and thus, the force F applied to the step 810 from the dicing blade decreases. As a result, when the stress applied to the step portion 800 through the step 810 decreases, and thus, the breakage of the step portion 800 is suppressed. Further, as shown in FIG. 14B, when the positional shift of the dicing blade 300 occurs, a step portion 820 having a relatively large width on one side of the fine groove 420 may be formed, but in this case, similarly, since the width of the step 810 can be made small compared with a case where the groove portion having the reverse tapered shape is not formed, it is possible to suppress the breakage of the step portion 800.

Figure 14C:
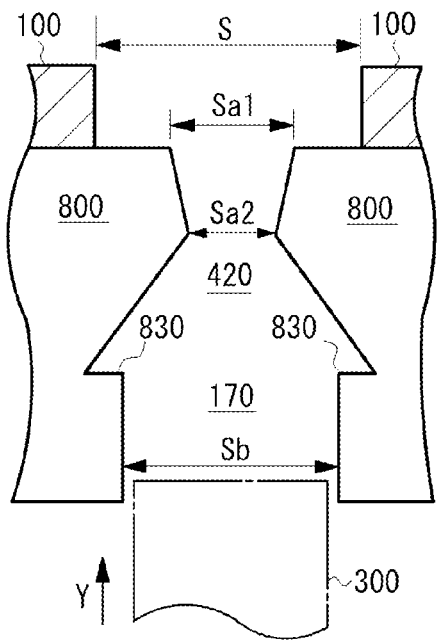
Figure 14D:
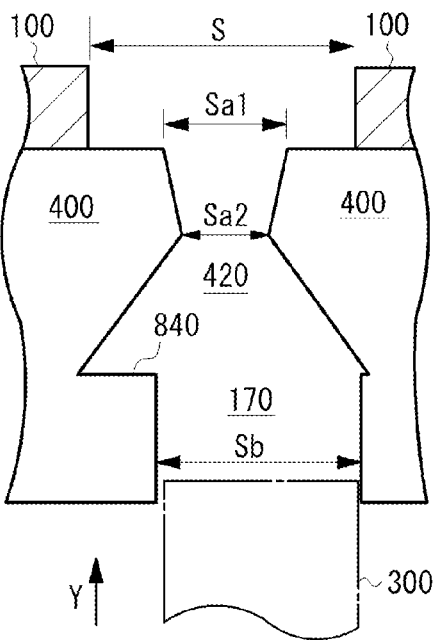

FIGS. 14C and 14D show cutting examples when the width Sa3 of the fine groove 420 is larger than the thickness (kerf width Sb) of the dicing blade 300. At least a part of the groove portion having the reverse tapered shape includes the width Sa3 larger than the kerf width Sb. FIG. 14C shows an ideal cutting operation in which the positional shift does not occur between the fine groove 420 (second groove portion) and the dicing blade. In this case, if the width of the fine groove is larger than the kerf width Sb at a connection position of both the grooves, the step portion that extends inside the groove 170 is not formed, and instead, a step portion 830 that extends outside the groove 170 is formed at the connection position of the grooves. Thus, the tip portion of the dicing blade 300 does not come into contact with the step portion 830, and thus, the force from the dicing blade 300 is not transmitted to the step portion 830, so that the breakage of the step portion 800 is suppressed.

As shown in FIG. 14D, even when the positional shift occurs in the dicing blade 300, if the amount of the positional shift is equal to or smaller than a predetermined range, since a step portion 840 that extends outside the groove 170 is formed, the stress is not applied to the step portion 800 from the dicing blade 300 through the step portion 840. Even if the positional shift amount is greater than the predetermined range, since the width of the step portion is small compared with a case where the fine groove portion having the reverse tapered shape is not formed, the stress to the step portion 800 is reduced.

The shape of the fine groove capable of suppressing the breakage of the step portion is not limited to the reverse tapered shape. Other shapes in which the bottom portion is enlarged may be used. FIGS. 15A and 15B show cross-sections having other shapes of the fine groove according to the present embodiment. A fine groove 430 shown in FIG. 15A includes a groove portion 430A having a forward tapered shape including linear opposite side surfaces that are inclined from the opening width Sa1 to the width Sa2 of depth D1 (Sa1>Sa2), and a width enlarged portion 430B that is connected to a lower part of the groove portion 430A and has spherical side surfaces of a depth D2. The maximum diameter Sa3 between the side walls that face each other in the direction parallel to the front surface of the substrate of the width enlarged portion 430B is greater than Sa2. Further, the depth D1 of the groove portion 430A having the forward tapered shape is greater than the depth where the adhesive layer of the dicing tape enters.

A fine groove portion 440 shown in FIG. 15B includes a groove portion 430A having a forward tapered shape including linear opposite side surfaces that are inclined from the opening width Sa1 to the width Sa2 of the depth D1 (Sa1>Sa2), and a rectangular width enlarged portion 440B that is connected to a lower part of the groove portion 440A and has approximately linear side surfaces of a depth D2. The width enlarged portion 440B is obtained by changing the spherical side surfaces of the width enlarged portion 430B shown in FIG. 15A into a linear shape. In this case, the width Sa3 of the width enlarged portion 440B is a distance between the side walls that face each other in the direction parallel to the front surface of the substrate, and the distance is greater than Sa2. Further, the depth D1 of the groove portion 440A having the forward tapered shape is greater than the depth where the adhesive layer of the dicing tape enters. The shapes of the width enlarged portion shown herein are examples, and any shape having a width greater than the width Sa2 in the middle of the fine groove may be used as the shapes of the width enlarged portion. The width enlarged portion may be formed in an elliptic shape or a flask shape. The fine grooves 430 and 440 shown in FIGS. 15A and 15B may be preferably formed using anisotropic etching or isotropic etching.

FIG. 16 is a flowchart illustrating another example of a semiconductor piece manufacturing method according to an embodiment of the invention. FIG. 16 is a flowchart illustrating the entire manufacturing processes including preparation (design method) before the series of manufacturing processes shown in FIG. 1 are performed in the mass production process. First, the semiconductor substrate is individualized according to the flow shown in FIG. 1 in a trial manufacturing process (S300). Here, it is not necessary to completely individualize the semiconductor substrate, and the procedure may be advanced up to a process of checking the degree of remaining of the adhesive layer to a minimum. Then, it is determined whether there is a problem by checking the degree of remaining of the adhesive layer (S310). Here, it is preferable that the adhesive layer does not completely remain, but even when the adhesive layer remains, if the remaining amount is allowable in the mass production process, it may be determined that there is no problem. Further, it is preferable that the plural substrates are individualized and the presence or absence of the problem is determined based on a large amount of results. Further, when it is determined that the problem is not present, the manufacturing condition is used as a manufacturing condition in the mass production process (S330). If it is determined that the problem is present, the manufacturing condition is changed (S320). Here, the manufacturing condition represents a manufacturing condition that affects the remaining of the adhesive layer in manufacturing.

In S320, the manufacturing condition is changed so that the remaining of the adhesive layer is reduced. For example, the forward tapered shape that forms the fine groove on the front surface side of the semiconductor substrate is changed to a shape in which the adhesive layer does not easily remain. Specifically, the angle having the forward tapered shape is changed to a moderated angle in the depth direction of the groove, the forward tapered shape is changed to have a deeper depth even at the same angle, or the width of the opening on the surface of the semiconductor substrate is changed to be enlarged. By performing the changes individually or in combination, a shape in which the adhesive layer does not easily remain is obtained. To this end, at least one of factors that affect the shape such as the shape of the photoresist or the etching condition is changed to obtain the above-mentioned shape. The change of the angle of the forward tapered shape to the moderated angle in the depth direction of the groove means that the angle formed by the front surface of the semiconductor substrate and the side surface of the groove that forms the forward tapered shape is reduced.

After the manufacturing condition is changed in S320, the semiconductor substrate is individualized in the trial manufacturing process again (S300). Then, it is determined whether there is a problem by checking the degree of remaining of the adhesive layer (S310). When there is a problem, steps S300 to S320 are repeated until there is no problem. When it is determined in S310 that there is no problem, the manufacturing condition is used as the manufacturing condition in the mass production process (S330).

In the initial process of S300, the fine groove on the front surface side of the semiconductor substrate may be a forward tapered shape, or may be a fine groove that does not have the forward tapered shape, for example, a vertical fine groove. That is, in the initial process of S300, the shape of the photoresist, the etching condition or the like may be set so that the forward tapered shape is not formed. Further, in the fine groove that does not have the forward tapered shape, when the remaining of adhesive layer does not cause a problem, the fine groove that does not have the forward tapered shape may be used even in the mass production process, and when the remaining of adhesive layer causes a problem, the manufacturing condition may be changed to form the forward tapered shape in S320.

When the shape shown in FIG. 7C is employed as the shape of the fine groove, it may be determined whether the adhesive layer intrudes more deeply than the depth D in FIG. 7C, without determining the remaining of the adhesive layer in S310. Further, when the adhesive layer intrudes so deeply, in S320, the manufacturing condition may be changed to form a forward tapered shape in which the adhesive layer does not intrude so deeply. In this way, regardless of the remaining of the adhesive layer, that is, even when the adhesive layer does not remain, by forming a shape in which the adhesive layer does not easily remain, even in manufacturing variation or the change of the manufacturing condition, the adhesive layer does not easily remain.

Hereinbefore, the preferred embodiments of the invention have been described, but the invention is not limited to a specific embodiment, and may include various modifications and changes in a range of the spirit of the invention disclosed in claims.

For example, the groove 170 on the rear surface side may be formed to have a depth that reaches the vicinity of the fine groove on the front surface side but does not communicate with the fine groove on the front surface side. That is, in the process of forming the groove 170 on the rear surface side shown in FIG. 3B, a part of the thickness of the semiconductor substrate may remain to form the groove 170 on the rear surface side. In this case, in a subsequent process, by applying a stress such as a tensile stress or a bending stress to the semiconductor substrate, the remaining part thereof may be divided to divide the semiconductor substrate. In such a semiconductor piece manufacturing method, similarly, by providing the reverse tapered shape as shown in FIG. 8A, when applying the stress to divide the remaining part, only the thickness part that remains between the fine groove on the front surface side and the groove 170 on the rear surface side is easily divided, and unintentional enlargement of crack is suppressed. As a result, the breakage of the semiconductor piece is suppressed.

Further, in the preferred embodiments of the invention, an example in which the opening width Sa1 on the front surface of the substrate is narrower than the width of the groove 170 on the rear surface side is shown. This is a preferred embodiment since the number of acquired semiconductor pieces increases compared with a full dicing method using the width of the groove 170 as it is. On the other hand, from the viewpoint of suppressing the remaining of the adhesive layer in the fine groove on the front surface side, the relationship between the width of the opening width Sa1 on the front surface of the substrate and the width of the groove 170 on the rear surface side is arbitrary. In this case, the widths may be the same, or the width of the groove 170 may be narrower.

Further, as the tip shape of the rotating cutting member that forms the groove 170 on the rear surface side, a cross section of the tip seen in the rotational direction may be a semicircular shape or a tapered shape, instead of the rectangular shape. Further, as the cutting member that forms the groove 170 on the rear surface side, a cutting member other than the cutting member that is in contact with the substrate while rotating, such as a laser apparatus, may be used. That is, the groove 170 on the rear surface side may be formed by laser processing.

Further, as an application example of the fine groove on the front surface side of the invention, the semiconductor substrate may be divided by performing grinding until reaching the fine groove on the front surface side of the semiconductor substrate from the rear surface of the semiconductor substrate, instead of forming the groove 170 on the rear surface side. Further, the semiconductor substrate may be divided by performing grinding up to a middle portion before reaching the fine groove on the front surface side of the semiconductor substrate, and then by dividing the remaining part by applying a stress such as a tensile stress or a bending stress to the semiconductor substrate. Further, the manufacturing method of the invention may be applied to a case where respective devices are individualized from a substrate that does not include a semiconductor, made of glass, polymer or the like.

INDUSTRIAL APPLICABILITY

The semiconductor piece manufacturing method of the invention is applied to a method for dividing (individualizing) a substrate-like member such as a semiconductor wafer on which plural semiconductor devices are formed to manufacture respective semiconductor pieces (semiconductor chips). The semiconductor device formed on the substrate is not particularly limited, and may include a light emitting device, an active device, a passive device, or the like. In a preferred embodiment, the manufacturing method of the invention is applied to a method of extracting a semiconductor piece including a light emitting device from a substrate, in which the light emitting device may be a surface light emitting type semiconductor laser, a light emitting diode, or a light emitting thyristor, for example.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor piece manufacturing method comprising:
    forming a groove on a front surface side including a first groove portion having a width that is gradually narrowed from a front surface of a substrate toward a rear surface thereof;

attaching a holding member having an adhesive layer on the front surface after the groove on the front surface side is formed;

forming a groove on a rear surface side having a width greater than the width of the groove on the front surface side along the groove on the front surface side from a rear surface side of the substrate by a rotating cutting member; and separating the holding member from the front surface after the groove on the rear surface side is formed, wherein the attaching the holding member comprises:
attaching a first portion of the adhesive layer on the front surface side having the groove on the front surface side; and
attaching a second portion of the adhesive layer along the first groove portion having the width gradually narrowing from the front surface of the substrate toward the rear surface thereof, and wherein the semiconductor piece manufacturing method further comprises applying UV light to cure the first and the second portion of the adhesive layer.

2. The semiconductor piece manufacturing method according to claim 1, wherein the groove on the front surface side includes a second groove portion that extends from a lowermost part of the first groove portion toward the rear surface of the substrate and has a width that is not narrower than the width of the lowermost part of the first groove part.

3. The semiconductor piece manufacturing method according to claim 2,
wherein the first groove portion has a depth in which the adhesive layer does not enter the second groove portion at a time point when the holding member is attached onto the front surface.

4. The semiconductor piece manufacturing method according to claim 2,
wherein the first groove portion has a depth in which the adhesive layer does not enter the second groove portion after the groove on the rear surface side is formed by the rotating cutting member.

5. The semiconductor piece manufacturing method according to claim 1, wherein the groove on the front surface side includes a second groove portion that extends from a lowermost part of the first groove portion toward the rear surface of the substrate and has a width that is gradually wider from the lowermost part of the first groove part.

6. The semiconductor piece manufacturing method according to claim 1,
wherein the groove on the front surface side is formed by anisotropic dry etching.

7. The semiconductor piece manufacturing method according to claim 1,
wherein the groove on the rear surface side is formed by a dicing blade.

8. The semiconductor piece manufacturing method according to claim 1,
wherein the width of the first groove portion gradually narrows at a substantially constant rate from the front surface of the substrate toward the rear surface thereof.

9. The semiconductor piece manufacturing method according to claim 1,
wherein the first groove portion has a V-shaped cross-section.

10. A semiconductor piece manufacturing method comprising:
forming, on a front surface of a substrate, an etching protective film having an opening of a shape in which the width thereof is gradually enlarged from the front surface in an upward direction;

forming a groove on a front surface side including a first groove portion having a width that is gradually narrowed from the front surface corresponding to the opening toward a rear surface of the substrate by anisotropic dry etching;

attaching a holding member having an adhesive layer on the front surface on which the groove on the front surface side is formed;

forming a groove on a rear surface side having a width greater than the width of the groove on the front surface side along the groove on the front surface side from the rear surface side of the substrate; and separating the holding member from the front surface after the groove on the rear surface side is formed, wherein the groove on the rear surface side is formed by a rotating cutting member, wherein the attaching the holding member comprises:
attaching a first portion of the adhesive layer on the front surface side having the grove on the front surface side; and
attaching a second portion of the adhesive layer along the first groove portion having the width gradually narrowing from the front surface of the substrate toward the rear surface thereof, and wherein the semiconductor piece manufacturing method further comprises applying UV light to cure the first and the second portion of the adhesive layer.

11. The semiconductor piece manufacturing method according to claim 8,
wherein the etching protective film has a shape in which the width of the opening is gradually enlarged from the front surface to an upper surface of the etching protective film.

12. The semiconductor piece manufacturing method according to claim 10,
wherein the etching protective film has a first film portion in which the width of the opening is gradually enlarged from the front surface in the upward direction and a second film portion that extends from an upper end of the first film portion in the upward direction at an angle smaller than an angle at which the width of the opening increases in the first film portion.

13. The semiconductor piece manufacturing method according to claim 10,
wherein the attaching a holding member comprises attaching a dicing tape on the front surface after the groove on the front surface side is formed, and
wherein the separating the holding member comprises separating the dicing tape from the front surface after the groove on the rear surface side is formed.

* * * * *